(12) United States Patent
Wu et al.

(10) Patent No.: US 11,637,126 B2
(45) Date of Patent: Apr. 25, 2023

(54) MEMORY DEVICE AND METHOD OF FORMING THE SAME

(71) Applicant: Taiwan Semiconductor Manufacturing Company, Ltd., Hsinchu (TW)

(72) Inventors: Chao-I Wu, Hsinchu County (TW); Yu-Ming Lin, Hsinchu (TW); Sai-Hooi Yeong, Hsinchu County (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/156,645

(22) Filed: Jan. 25, 2021

(65) Prior Publication Data

US 2021/0375937 A1  Dec. 2, 2021

Related U.S. Application Data

(60) Provisional application No. 63/031,574, filed on May 29, 2020.

(51) Int. Cl.
| | |
|---|---|
| H01L 27/11597 | (2017.01) |
| H01L 27/1159 | (2017.01) |
| H01L 27/11587 | (2017.01) |
| H01L 27/11585 | (2017.01) |
| H01L 29/51 | (2006.01) |

(Continued)

(52) U.S. Cl.
CPC .... *H01L 27/11597* (2013.01); *H01L 27/1159* (2013.01); *H01L 27/11553* (2013.01); *H01L 27/11585* (2013.01); *H01L 27/11587* (2013.01); *H01L 29/40111* (2019.08); *H01L 29/517* (2013.01); *H01L 29/518* (2013.01)

(58) Field of Classification Search
CPC ......... H01L 27/11553; H01L 27/11585; H01L 27/1159; H01L 27/11597; H01L 29/40111; H01L 29/516; H01L 29/517; H01L 29/518
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |

(Continued)

FOREIGN PATENT DOCUMENTS

KR    20180059271 A  *  6/2018  ........ H01L 27/11587

*Primary Examiner* — Matthew E Warren
(74) *Attorney, Agent, or Firm* — JCIPRNET

(57) ABSTRACT

Provided are a memory device and a method of forming the same. The memory device includes a substrate, a layer stack, and a plurality of composite pillar structures. The layer stack is disposed on the substrate. The layer stack includes a plurality of conductive layers and a plurality of dielectric layers stacked alternately. The composite pillar structures respectively penetrate through the layer stack. Each composite pillar structure includes a dielectric pillar; a pair of conductive pillars penetrating through the dielectric pillar and electrically isolated from each other through a portion of the dielectric pillar; a channel layer covering both sides of the dielectric pillar and the pair of conductive pillars; a ferroelectric layer disposed between the channel layer and the layer stack; and a buffer layer disposed between the channel layer and the ferroelectric layer.

20 Claims, 27 Drawing Sheets

(51) Int. Cl.
*H01L 27/11553* (2017.01)
*H01L 21/28* (2006.01)

(56) References Cited

U.S. PATENT DOCUMENTS

| | | | |
|---|---|---|---|
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2016/0035789 A1* | 2/2016 | Mine | G11C 13/0069 257/4 |
| 2019/0074062 A1* | 3/2019 | Chen | G11C 16/0483 |
| 2021/0175253 A1* | 6/2021 | Han | H01L 29/78642 |
| 2021/0366932 A1* | 11/2021 | Lee | H01L 29/40111 |
| 2021/0375933 A1* | 12/2021 | Lu | H01L 29/516 |

* cited by examiner

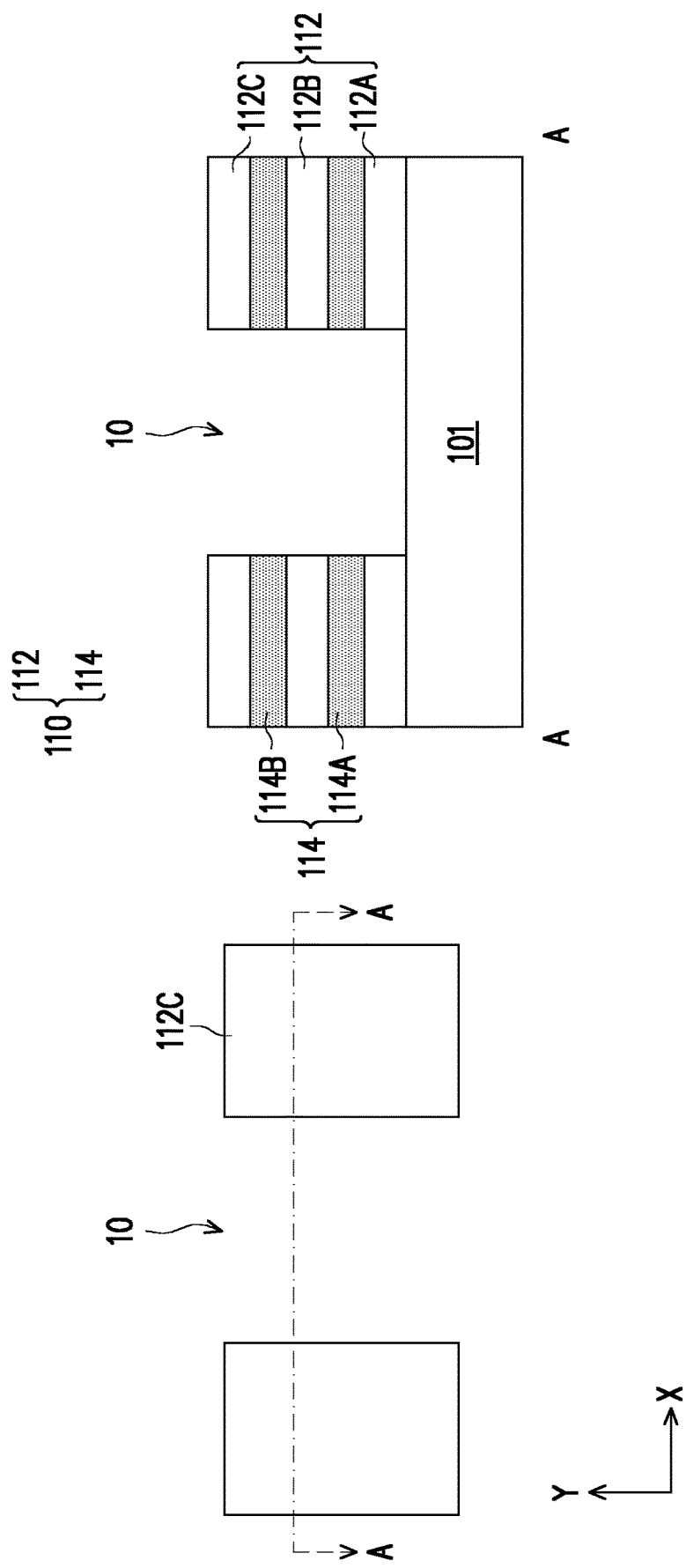

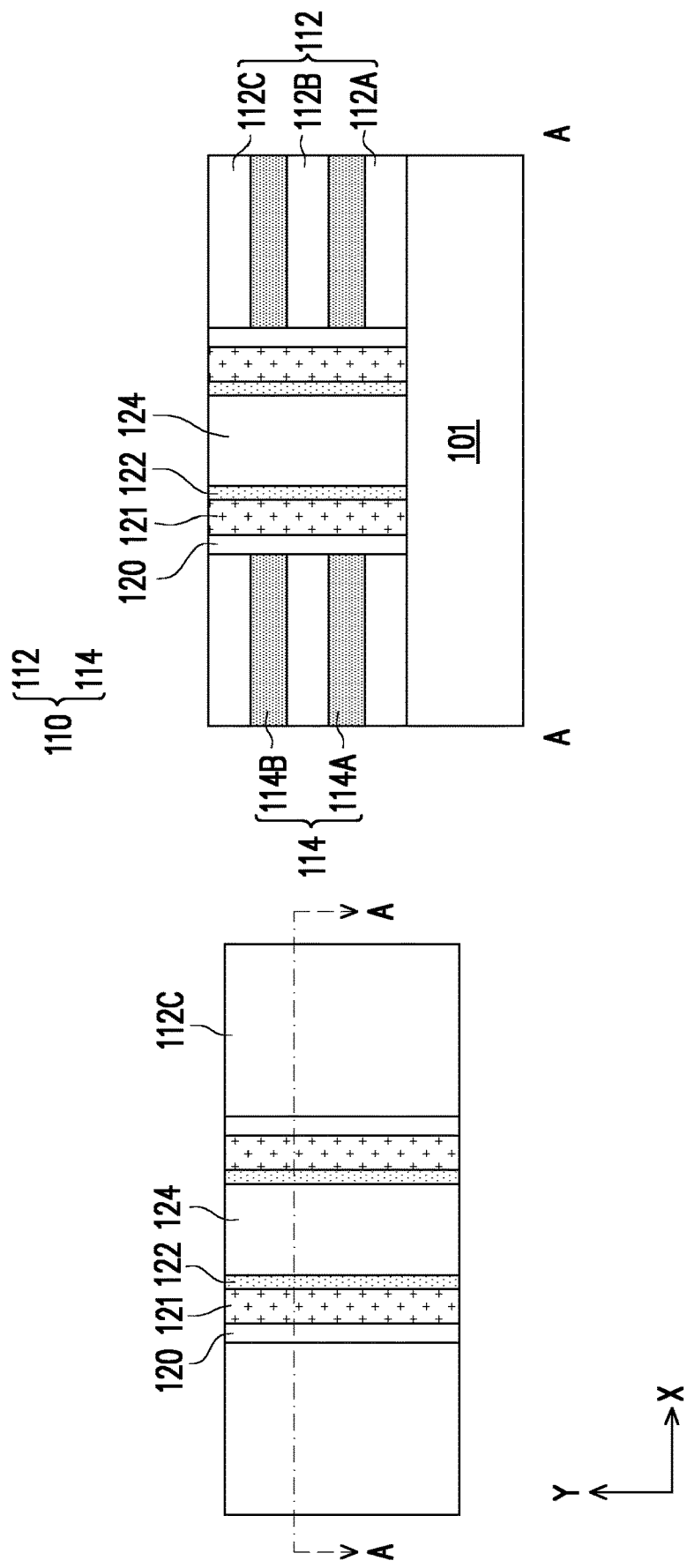

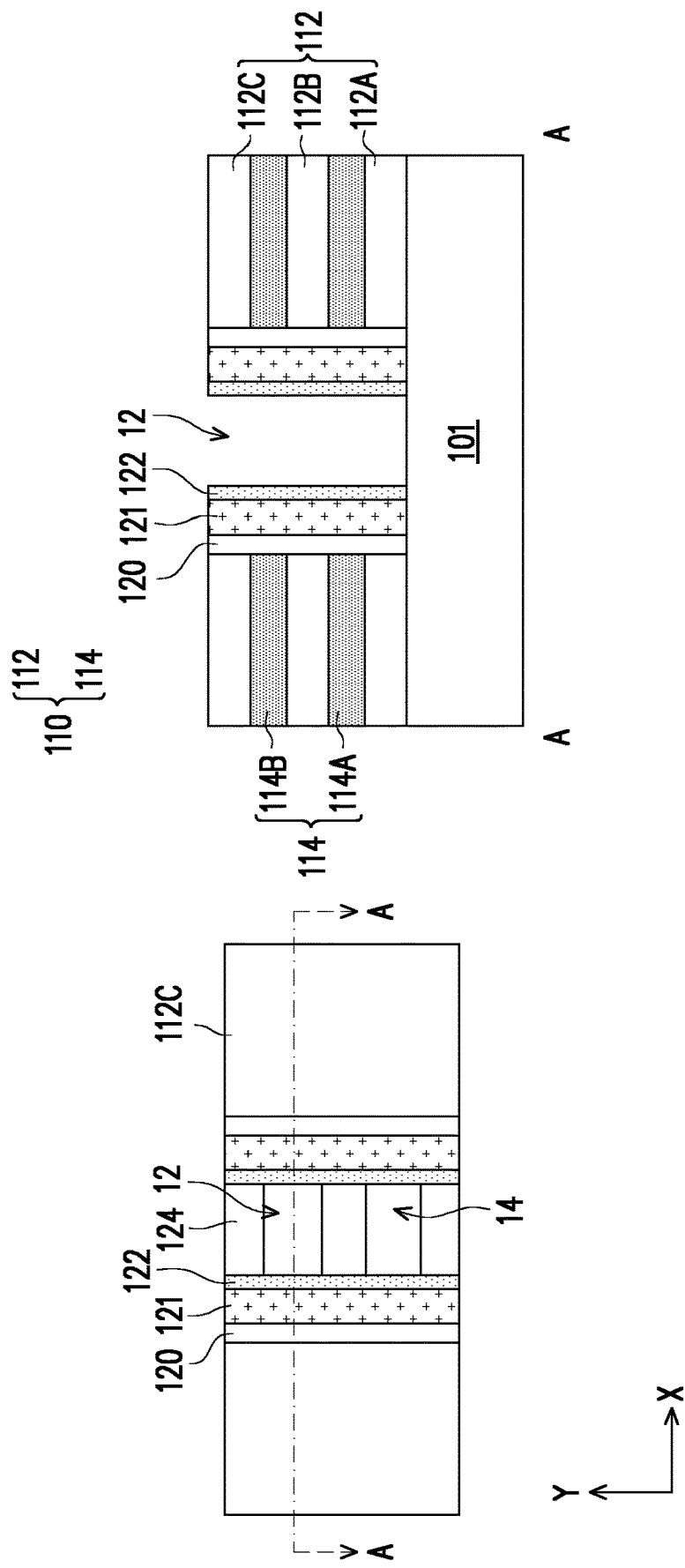

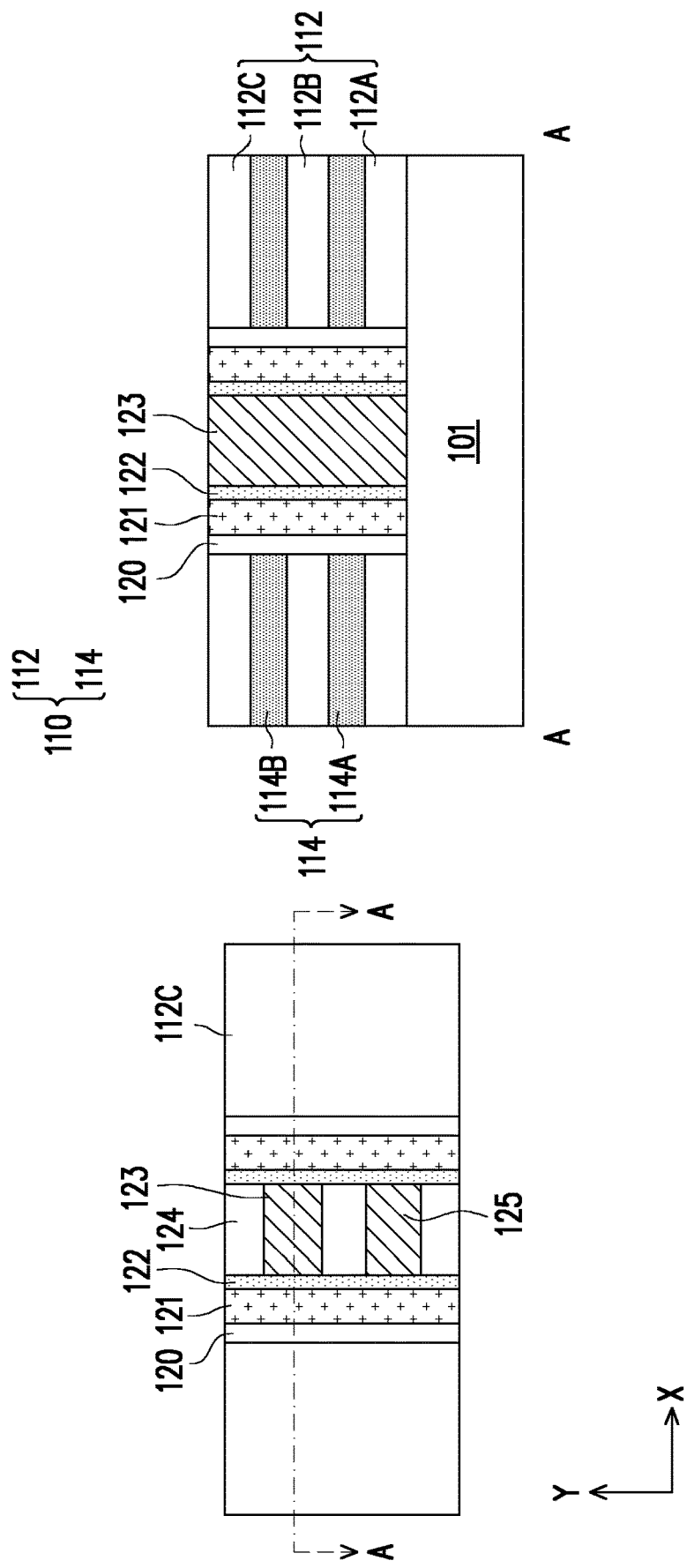

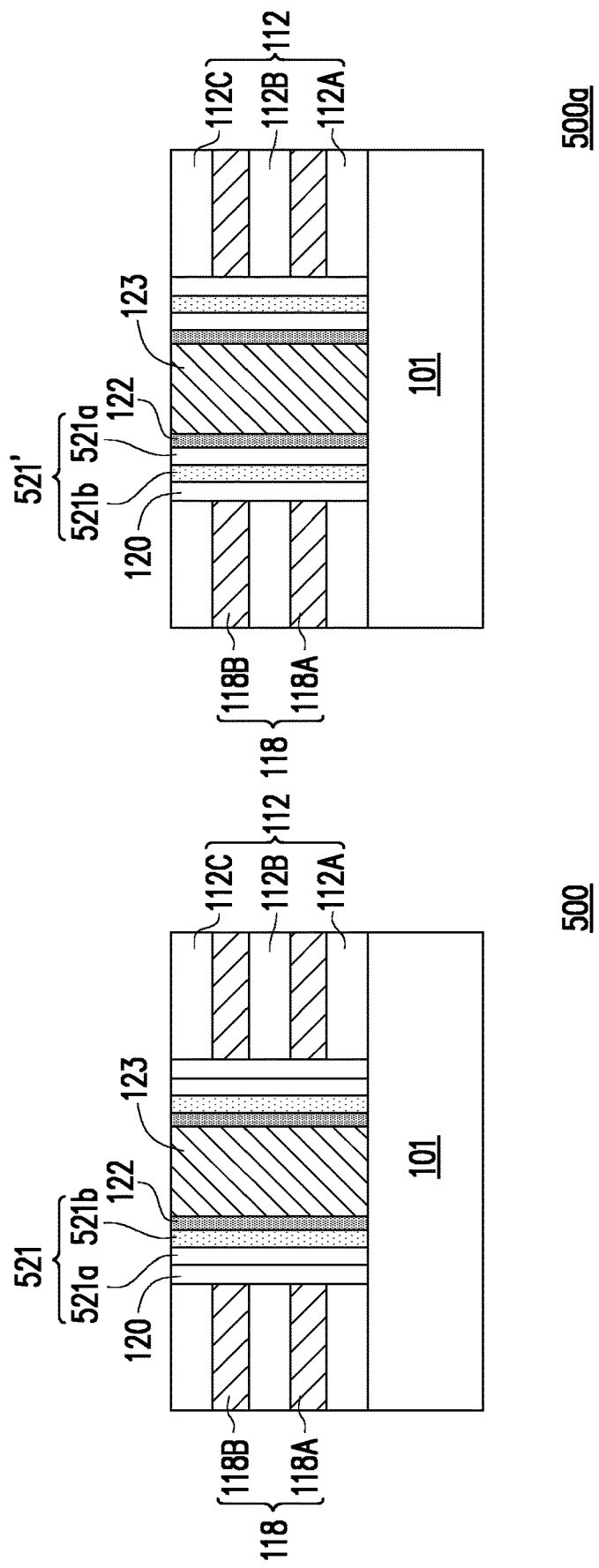

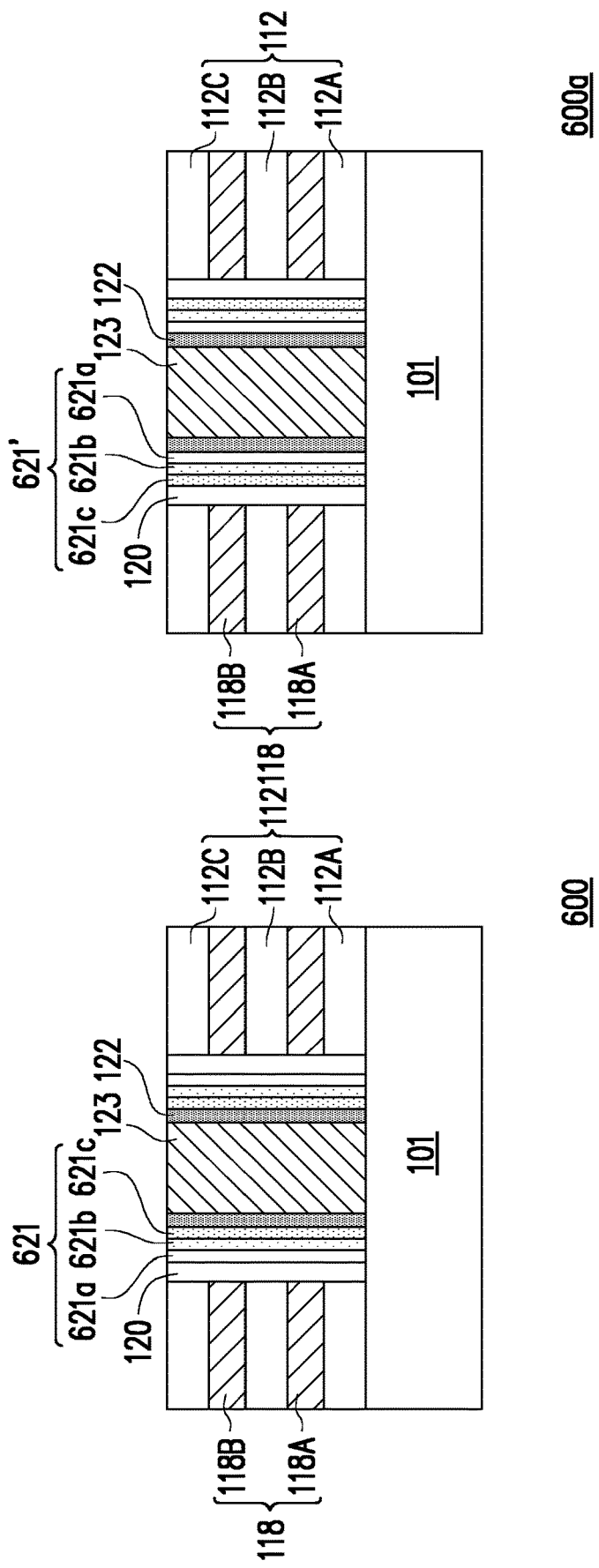

MEMORY DEVICE AND METHOD OF FORMING THE SAME

CROSS-REFERENCE TO RELATED APPLICATION

This application claims the priority benefit of U.S. provisional application Ser. No. 63/031,574, filed on May 29, 2020. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional (3D) memory device has been introduced to replace a planar memory device. However, 3D memory device has not been entirely satisfactory in all respects, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 10A are top views of a method of forming a three-dimensional (3D) memory device in accordance with a first embodiment.

FIG. 2B to FIG. 10B are cross-sectional views along a cross-section A-A of FIG. 2A to FIG. 10A.

FIG. 14A to FIG. 14D are cross-sectional views of a 3D memory device in accordance with some alternative embodiments.

FIG. 15 to FIG. 21A are cross-sectional views of a method of forming a 3D memory device in accordance with a second embodiment.

FIG. 16B is a top view of a 3D memory device of FIG. 16A.

FIG. 21B is a top view of a 3D memory device of FIG. 21A.

DETAILED DESCRIPTION

Figure 1:
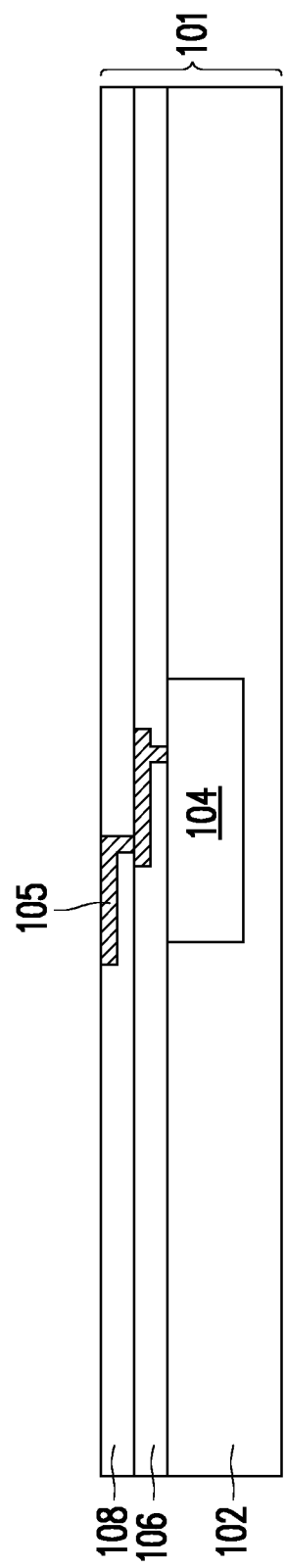
FIG. 1 is a cross-sectional view of a substrate in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Among various non-volatile memories, the ferroelectric field effect transistor (FeFET) is a promising candidate for high-density, low-power application. Due to its field-driven operation, FeFET has advantages such as non-destructive readout, high program/erase speed, and low power consumption. In addition, FeFET has attracted more attention because of its high scalability and high CMOS compatibility. Toward even higher density, a 3D vertical structure has been proposed. A 3D vertical stacked ferroelectric structure has been recently developed and its memory operation have been demonstrated. Generally, poly-silicon is used as a channel material. However, there are several challenges with the poly-silicon channel, such as low mobility of the very thin poly-silicon channel, and an interfacial layer (IL) with a low dielectric constant between the ferroelectric material and poly-silicon. Since the capacitance mismatch of IL with a low dielectric constant and the ferroelectric material, a large voltage is applied on the IL during the operation, which may eventually result in the breakdown of the IL, thereby causing the endurance failure. In addition, the IL with low dielectric constant may further enhance the charge trapping which results in the threshold voltage shift issue, thereby degrading the reliability.

According to one embodiment of invention, a FeFET with an oxide semiconductor channel has been proposed. The oxide semiconductor channel is suitable for fast access speed due to its high mobility with very thin body. However, in practical, a thin interfacial layer (IL) still exists between the ferroelectric material and the oxide semiconductor channel, so as to occur the charge trapping issue. Even if no IL is formed between the ferroelectric material and the oxide semiconductor channel, some traps and/or defects would be formed at the interface between the ferroelectric material and the oxide semiconductor channel to trap charges, thereby degrading the reliability. The traps and/or defects at the interface between the ferroelectric material and the oxide semiconductor channel may come from un-occupied oxygen vacancies, dangling bonds, or the like.

In accordance with some embodiments, a three-dimensional (3D) memory device including a buffer layer between the ferroelectric layer and the channel layer is proposed. The buffer layer with a high dielectric constant is able to decrease the interfacial charge trapping between the ferroelectric layer and the channel layer, so as to enhance the switchable performance of the ferroelectric layer accordingly, thereby decreasing the operation voltage of the 3D memory device and increasing the operation window of the 3D memory device. In this case, the reliability and the endurance of the 3D memory device are improved accordingly.

FIG. 1 is a cross-sectional view of a substrate in accordance with some embodiments. FIG. 2A to FIG. 10A are top views of a method of forming a three-dimensional (3D) memory device in accordance with a first embodiment. FIG. 2B to FIG. 10B are cross-sectional views along a cross-section A-A of FIG. 2A to FIG. 10A. The 3D memory device 100 is a 3D memory device with a ferroelectric material, and may be, but not limited thereto, a ferroelectric field effect transistor (FeFET) memory.

Referring to FIG. 1, a plurality of electrical components 104, such as transistors, resistors, capacitors, inductors, diodes, or the like, are formed in a device region of a semiconductor substrate 102 in the front-end-of-line (FEOL) processing of semiconductor manufacturing. For example, the transistor may include fin field effect transistors (FinFETs), nanostructure transistor, gate-all-around transistor (e.g. nanowire, nanosheet, or the like), planar transistor, etc. The transistor may be formed by gate-first processes or gate-last processes. The semiconductor substrate 102 may be a bulk substrate, such as a silicon substrate, doped or undoped, or an active layer of a semiconductor-on-insulator (SOI) substrate. The semiconductor substrate 102 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The electrical components 104 may be formed in/on the semiconductor substrate 102 using any suitable formation method known or used in semiconductor manufacturing.

After the electrical components 104 are formed, an interconnect structure is formed over the semiconductor substrate 102 to connect the electrical components 104, so as to form functional circuits. The interconnect structure may include a plurality of dielectric layers (e.g., 106, 108) and electrically conductive features 105 (e.g., vias, metal lines) formed in the dielectric layers. In some embodiments, the interconnect structure is formed in the back-end-of-line (BEOL) processing of semiconductor manufacturing. Formation of the interconnect structure is known in the art, thus details are not repeated here. To avoid clutter and for ease of discussion, the semiconductor substrate 102, the electrical components 104, and the interconnect structure over the semiconductor substrate 102 are collectively referred to as an underlying structure 101 in the discussion hereinafter, and the details of the underlying structure 101 illustrated in FIG. 1 may be omitted in subsequent figures.

FIG. 2 to FIG. 10 illustrate additional processing steps in the BEOL processing to form the 3D memory device 100 in accordance with the first embodiment. Referring now to FIG. 2A and FIG. 2B, a layer stack 110 is formed on the underlying structure 101. In detail, the layer stack 110 may include a plurality of dielectric layers 112A, 112B, 112C and a plurality of sacrificial layers 114A, 114B stacked alternately on the underlying structure 101. Although only three dielectric layers 112A, 112B, 112C, and two sacrificial layers 114A, 114B are illustrated in FIG. 2B, the embodiments of the present disclosure are not limited thereto. In other embodiments, the number of the dielectric and sacrificial layers can be adjusted as needed. For example, the number of the dielectric layers may be greater than 4 layers, and the number of the sacrificial layers may be >4 layers. Hereinafter, the dielectric layers 112A, 112B, 112C are collectively referred to as the dielectric layers 112, and the sacrificial layers 114A, 114B are collectively referred to as the sacrificial layers 114.

In some embodiments, the dielectric layers 112 may include a dielectric material, such as silicon nitride, silicon oxide, silicon oxynitride, phosphosilicate glass (PSG), borosilicate glass (BSG), boron-doped phosphosilicate glass (BPSG), or the like, or a combination thereof. The dielectric layer 112 may be formed, by chemical vapor deposition (CVD), atomic layer deposition (ALD), or the like. In some embodiments, the dielectric layers 112 (e.g., 112A, 112B, 112C) have the same dielectric material, such as silicon oxide. However, the embodiments of the present disclosure are not limited thereto, in other embodiments, the dielectric layers 112 (e.g., 112A, 112B, 112C) have different dielectric materials.

Figures 10A, 10B:
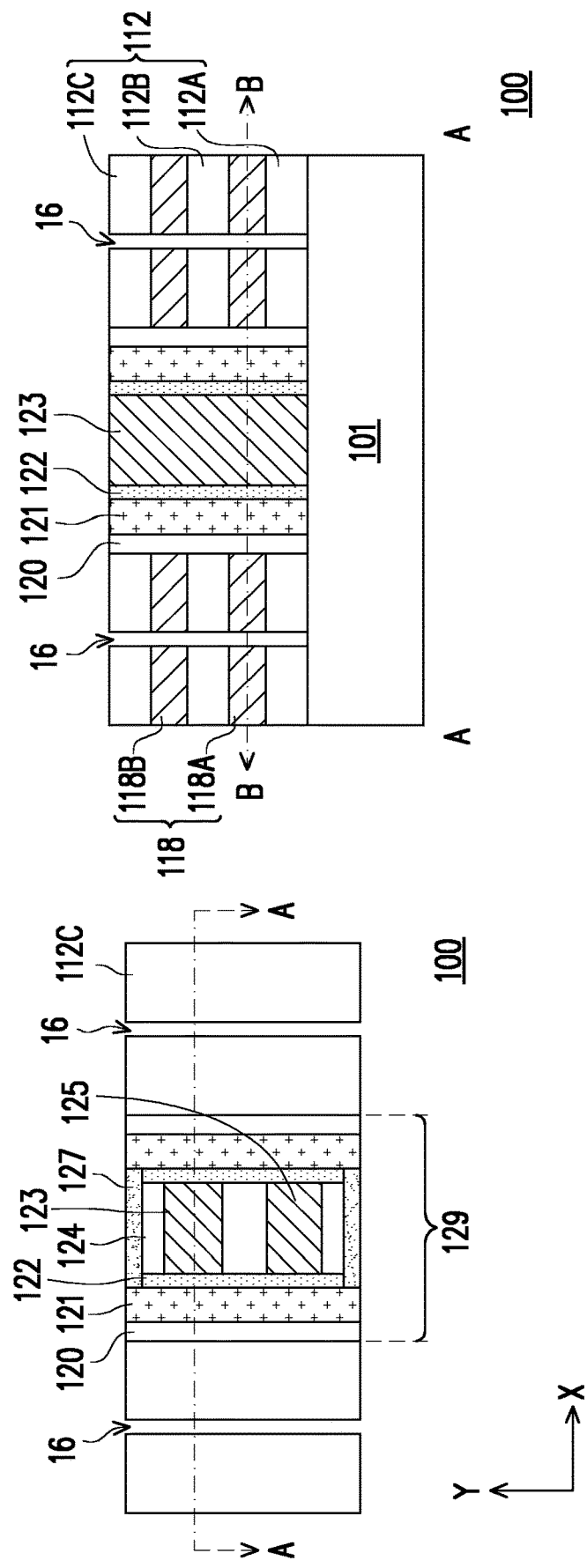

In some embodiments, the sacrificial layers 114 may include a dielectric material, such as silicon nitride, silicon oxide, silicon oxynitride, phosphosilicate glass (PSG), borosilicate glass (BSG), boron-doped phosphosilicate glass (BPSG), or the like, or a combination thereof. The sacrificial layers 114 may be formed, by CVD, ALD, or the like. In some embodiments, the sacrificial layers 114 (e.g., 114A, 114B) have the same dielectric material, such as silicon nitride. However, the embodiments of the present disclosure are not limited thereto, in other embodiments, the sacrificial layers 114 (e.g., 114A, 114B) have different dielectric materials. It should be noted that, in the present embodiment, the sacrificial layers 114 and the dielectric layers 112 include different dielectric materials with different etching selectivities. For example, the sacrificial layers 114 are formed of silicon nitride, and the dielectric layers 112 are formed of silicon oxide. In this case, the sacrificial layers 114 may be replaced in subsequent steps to form conductive layers 118 (as shown in FIG. 10B).

Next, referring to FIG. 3A and FIG. 3B, a trench 10 is formed in the layer stack 110 to expose the underlying structure 101. That is, the trench 10 penetrates through the layer stack 110, and the underlying structure 101 is exposed at the bottoms of the trench 10. As shown in the top view of FIG. 3A, the trench 10 extends along a Y direction. In addition, the trench 10 exposes sidewalls of the dielectric layers 112 and sidewalls of the sacrificial layers 114. Note that in the discussion herein, a sidewall of the layer stack 110 includes the corresponding sidewalls of all the constituent layers (e.g., 112 and 114) of that layer stack. For example, a sidewall of the layer stack 110 exposed by the trench 10 includes the sidewalls of the dielectric layers 112, and the sidewalls of the sacrificial layers 114 that are exposed by the trench 10.

In some embodiments, the trench 10 is formed by an anisotropic etching process, such as a plasma etching process. A mask pattern, such as a patterned photoresist, may be formed on the layer stack 110. The anisotropic etching process may then be performed by using the mask pattern as an etching mask to form the trench 10. After the anisotropic etching process is finished, the mask pattern (e.g., patterned photoresist) may be removed by a suitable removal process, such as ashing or stripping.

Referring to FIG. 4A and FIG. 4B, a ferroelectric layer 120 is first formed to line or cover the sidewalls of the trench 10. The ferroelectric layer 120 may have a material that is capable of switching between two different polarization directions by applying an appropriate voltage differential across the ferroelectric layer 120. For example, the polarization of the ferroelectric layer 120 may change due to an electric field resulting from applying the voltage differential.

In some embodiments, the ferroelectric layer 120 may include a ferroelectric material, such as HZO, HSO, HfSiO, HfLaO, HfO$_2$, HfZrO$_2$, ZrO$_2$, or HfO$_2$ doped by La, Y, Si, or Ge, and may be formed by PVD, CVD, ALD, or the like. In some alternative embodiments, the ferroelectric layer 120 may be a high-k dielectric material, such as a hafnium (Hf) based dielectric material, or the like. For example, the ferroelectric material 220 is a hafnium-comprising compound, such as hafnium zirconium oxide (HfZnO), hafnium aluminum oxide (HfAlO), hafnium lanthanum oxide (HfLaO), hafnium cerium oxide (HfCeO), hafnium oxide (HfO), hafnium gadolinium oxide (HfGdO), hafnium silicon oxide (HfSiO), hafnium zirconium lanthanum oxide (HfZrLaO), hafnium zirconium gadolinium oxide (HfZrGdO), hafnium zirconium yttrium oxide (HfZrYO), hafnium zirconium cerium oxide (HfZrCeO), hafnium zirconium strontium oxide (HfZrSrO), or the like. In addition, the hafnium-comprising compound may further be doped by some dopants, such as La, Y, Si, Ge, Ce, Gd, Sr, or the like, or a combination thereof. By doping these dopants in the hafnium-comprising compound, an orthorhombic lattice structure can be achieved in the ferroelectric layer 120. In some embodiments, the hafnium-comprising compound with the orthorhombic lattice structure has a desired ferroelectric property to achieve the switchable performance of the ferroelectric layer in the memory device. In addition, by including the dopants, an orthorhombic lattice structure in the ferroelectric layer 120 may be achieved relatively easily (e.g., at a lower temperature), and the ferroelectric layer 120 may be formed within the relatively low thermal budget of BEOL processes (e.g., at a temperature that does not damage front end of line (FEOL) features, such as the electrical components in the underlying structure 101).

In some embodiments, the ferroelectric layer 120 is formed by depositing a ferroelectric material that conformally covers the bottoms and sidewalls of the trench 10, and further cover the upper surface of the topmost dielectric layer 112C; and then performing an anisotropic etching process to remove the ferroelectric material on the bottom of the trench 10 and on the upper surface of the topmost dielectric layer 112C, as shown in FIG. 4B. In this case, the ferroelectric layer 120 may have a rounded or curved top surface adjacent to the topmost dielectric layer 112C. In some embodiments, the ferroelectric layer 120 may have a flat top surface, as shown in FIG. 4B.

Next, as shown in FIG. 4A and FIG. 4B, a buffer layer 121 is formed in the trench 10 to cover the ferroelectric layer 120. The buffer layer 121 may include a high dielectric constant (high-k) dielectric material which not trap charge, such as Al$_2$O$_3$, TiO$_2$, ZrO$_2$, La$_2$O$_3$, MgO, HfZrO, HfAlO, HfLaO, HfCeO, HfO, HfGdO, HfSiO or the like, or a combination thereof. The buffer layer 121 may include the high-k dielectric material with a dielectric constant greater than 5, such as k=10-30. In some embodiments, the buffer layer 121 has a dielectric constant lower than or equal to a dielectric constant of the ferroelectric layer 120. In some alternative embodiments, the buffer layer 121 has a dielectric constant greater than the dielectric constant of the ferroelectric layer 120. Other material may be applicable. In some embodiments, other material includes barium titanium oxide (BaTiO$_3$), lead titanium oxide (PbTiO$_3$), lead zirconium oxide (PbZrO$_3$), lithium niobium oxide (LiNbO$_3$), sodium niobium oxide (NaNbO$_3$), potassium niobium oxide (KNbO$_3$), potassium tantalum oxide (KTaO$_3$), bismuth scandium oxide (BiScO$_3$), bismuth iron oxide (BiFeO$_3$), hafnium erbium oxide (Hf$_{1-x}$Er$_x$O), hafnium lanthanum oxide (Hf$_{1-x}$La$_x$O), hafnium yttrium oxide (Hf$_{1-x}$Y$_x$O), hafnium gadolinium oxide (Hf$_{1-x}$Gd$_x$O), hafnium aluminum oxide (Hf$_{1-x}$Al$_x$O), hafnium titanium oxide (Hf$_{1-x}$Ti$_x$O), hafnium tantalum oxide (Hf$_{1-x}$Ta$_x$O), or the like. However, the embodiments of the present disclosure are not limited thereto, in other embodiments, other suitable materials which not trap charge in the operation are also candidates for the buffer layer 121. In some embodiments, the method of forming the buffer layer 121 includes performing a suitable deposition technique, such as CVD, PECVD, metal oxide chemical vapor deposition (MOCVD), ALD, molecular beam deposition (MBD), or the like.

In some alternative embodiments, the buffer layer 121 is a nitrogen-doped dielectric layer and a nitrogen doping concentration of the buffer layer 121 is gradient distribution. For example, the buffer layer 121 is the nitrogen-doped Al$_2$O$_3$ layer, and the nitrogen doping concentration of the buffer layer 121 gradually increases along a direction from the channel layer 122 to the ferroelectric layer 120. On the other hands, the buffer layer 121 may be the nitrogen-doped Al$_2$O$_3$ layer, and the nitrogen doping concentration of the buffer layer 121 gradually decreases along a direction from the channel layer 122 to the ferroelectric layer 120. The nitrogen doping concentration of the buffer layer 121 may be less than 15%, such as 3% to 10%. In some alternative embodiments, when the buffer layer 121 is the nitrogen-doped Al$_2$O$_3$ layer, the buffer layer 121 may be formed by depositing the Al$_2$O$_3$ film and in-situ doping in the Al$_2$O$_3$ film with the nitrogen dopants, or performing a nitride treatment after depositing the Al$_2$O$_3$ film.

In some embodiments, the buffer layer 121 is formed by depositing a buffer material that conformally covers the bottom of the trench 10, the ferroelectric layer 120, and further covers the upper surface of the topmost dielectric layer 112C; and then performing an anisotropic etching process to remove the buffer material on the bottom of the trench 10 and on the upper surface of the topmost dielectric layer 112C. In this case, the buffer layer 121 may have a rounded or curved top surface. In some embodiments, the buffer layer 121 may have a flat top surface, as shown in FIG. 4B.

Although the buffer layer 121 with a single-layered structure is illustrated in FIG. 4B, the embodiments of the present disclosure are not limited thereto. In other embodiments, the buffer layer with a bi-layered structure, a triple-layered structure, or a multi-layered structure may be formed on the ferroelectric layer 120, the detail will be illustrated in the following paragraphs corresponding to FIG. 14A to FIG. 14D. In some embodiments, the buffer layer 121 have a thickness of 2 nm to 5 nm, such as 3 nm. Other thickness ranges (e.g., more than 5 nm or 6-10 nm) may be applicable. In some embodiments, the buffer layer 121 is formed in a fully amorphous state. In alternative embodiments, the buffer layer 121 is formed in a partially crystalline state; that is, the buffer layer 121 is formed in a mixed crystalline-amorphous state and having some degree of structural order. In yet alternative embodiments, the buffer layer 121 is formed in a fully crystalline state.

Thereafter, a channel layer 122 is formed in the trench 10 to cover the buffer layer 121. In some embodiments, the channel layer 122 is formed by depositing a channel material that conformally covers the bottom of the trench 10, the sidewall of the buffer layer 121, and further covers the upper surface of the topmost dielectric layer 112C; and then performing an anisotropic etching process to remove the channel material on the bottom of the trench 10 and on the upper surface of the topmost dielectric layer 112C. In this case, the channel layer 122 may have a rounded or curved top surface. In some embodiments, the channel layer 122 may have a flat top surface, as shown in FIG. 4B.

In some embodiments, the channel layer 122 may include a metal oxide (or oxide semiconductor), such as indium gallium zinc oxide (IGZO), formed by a suitable formation method, such as PVD, CVD, ALD or the like. Other suitable materials for the ferroelectric layer 120 include zinc oxide (ZnO), indium tungsten oxide (InWO), tungsten oxide (WO), tantalum oxide (TaO), and molybdenum oxide (MoO). In an example embodiment, the dielectric layers 112 are formed of $SiO_2$, the sacrificial layers 114 are formed of SiN, the ferroelectric layer 120 is formed of $HfO_2$, the buffer layer 121 is formed of nitrogen-doped $Al_2O_3$, and the channel layer 122 is formed of IGZO.

It should be noted that the buffer layer 121 is formed between the ferroelectric layer 120 and the channel layer 122 to reduce the interfacial charge trapping, thereby enhance the reliability of the 3D memory device 100. In this case, as the interfacial trap density decreases, the switchable performance of the ferroelectric layer 120 enhances accordingly, thereby decreasing the operation voltage of the 3D memory device 100 and increasing the operation window of the 3D memory device 100. In addition, the buffer layer 121 has a high dielectric constant (e.g., k>5) in which can improve the endurance of the 3D memory device 100, thereby increasing the reliability of the 3D memory device 100.

After forming the channel layer 122, a dielectric material is formed to fill in the trench 10. The dielectric material may include silicon nitride, silicon oxide, silicon oxynitride, phosphosilicate glass (PSG), borosilicate glass (BSG), boron-doped phosphosilicate glass (BPSG), or the like, or a combination thereof, and may be formed by a suitable deposition method such as CVD, ALD, or the like. After the dielectric material is formed, a planarization process, such as chemical mechanical planarization (CMP) process, may be performed to remove excessive portions of the dielectric material from the upper surface of the topmost dielectric layer 112C. In this case, the remaining portions of the dielectric material in the trench 10 forms a dielectric pillar 124.

Referring to FIG. 5A and FIG. 5B, openings 12 and 14 are formed in the dielectric pillar 124. The openings 12 and 14 may penetrate through the dielectric pillar 124 to expose the underlying structure 101. As shown in FIG. 5A, the openings 12 and 14 are separated from each other by a portion of the dielectric pillar 124. In some embodiments, the openings 12 and 14 are formed by an anisotropic etching process, such as a plasma etching process. A mask pattern, such as a patterned photoresist, may be formed on the layer stack 110. The anisotropic etching process may then be performed by using the mask pattern as an etching mask to form the openings 12 and 14. After the anisotropic etching process is finished, the mask pattern (e.g., patterned photoresist) may be removed by a suitable removal process, such as ashing or stripping. In some embodiments, the openings 12 and 14 may be formed in the same step, or formed successively.

Referring to FIG. 6A and FIG. 6B, a conductive material is formed to fill in the openings 12 and 14. After the conductive material is formed, a planarization process, such as CMP process, may be performed to remove excessive portions of the conductive material from the upper surface of the topmost dielectric layer 112C. Accordingly, the remaining portions of the conductive material in the openings 12 and 14 form conductive pillars 123 and 125, respectively. In some embodiments, the conductive pillars 123 and 125 may be formed of the same source/drain (S/D) material, such as W, Ru, Ti, TiN, TaN, or the like. In this case, the conductive pillar 123 may be referred to as a source metal layer, and the conductive pillar 125 may be referred to as a drain metal layer, vice versa.

Figures 7A, 7B:
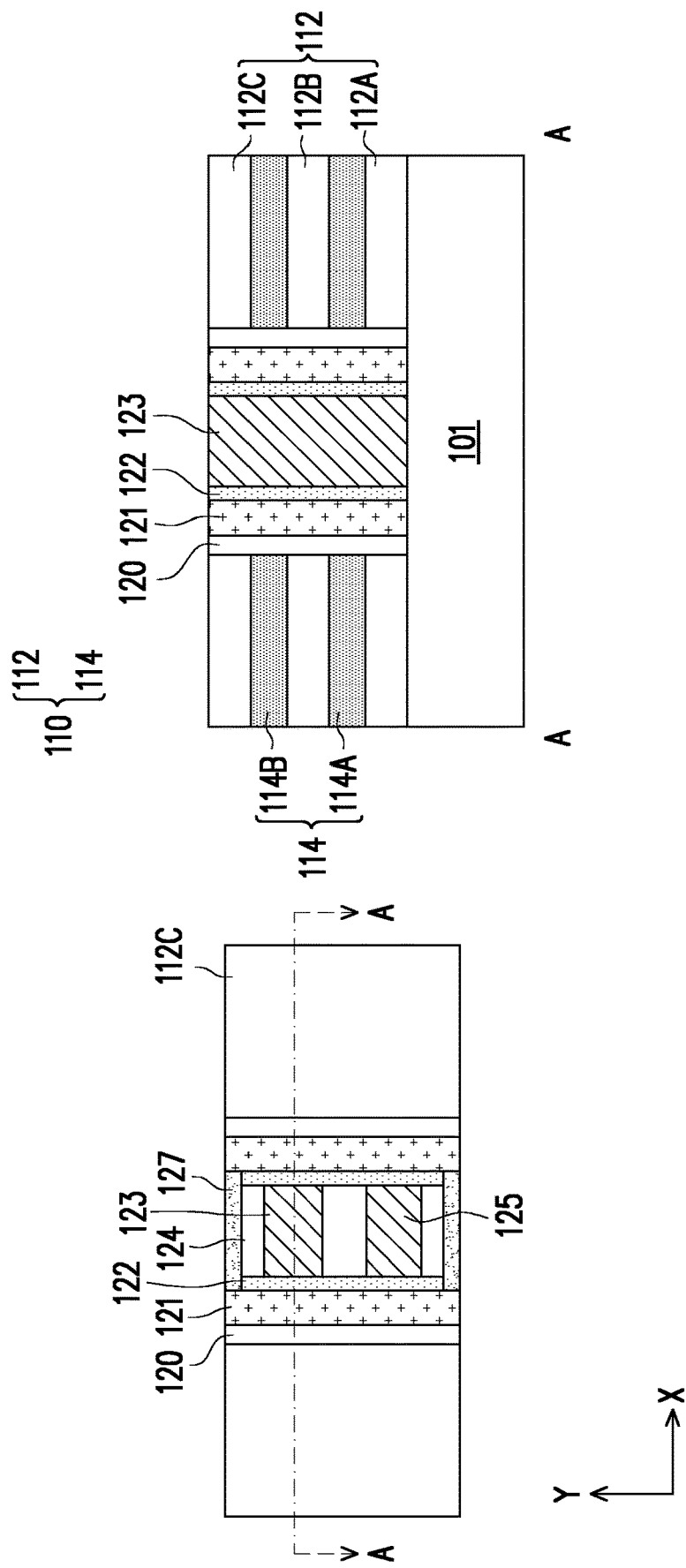

Referring to FIG. 7A and FIG. 7B, isolation structures 127 are formed to penetrate through the dielectric pillar 124. Specifically, as shown in FIG. 7A, the isolation structures 127 further extend to cut off the channel layers 122, thereby defining a memory cell with a pair of source/drain (S/D) regions 123 and 125. That is, one isolation structure 127 is disposed at one side of the pair of S/D regions 123 and 125 (i.e., close to the S/D region 123), and another isolation structure 127 is disposed at another side of the pair of S/D regions 123 and 125 (i.e., close to the S/D region 125). From the perspective of a memory array, the isolation structures 127 are disposed between adjacent pairs of S/D regions 123 and 125.

In some embodiments, the isolation structures 127 are formed by etching a portion of the dielectric pillar 124 and a portion of the channel layers 122 to form openings exposing the underlying structure 101; an insulating material is formed in the openings; and performing a planarization process, such as CMP process, to remove excessive portions of the insulating material from the upper surface of the topmost dielectric layer 112C. In some embodiments, the insulating material includes silicon oxide, silicon nitride, silicon oxynitride, tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, benzocyclobutene (BCB), SiLK™ (Dow Chemical, Midland, Mich.), polyimide, other low-k dielectric material, or combinations thereof. Herein, the low-k dielectric material used in the isolation structures 127 between adjacent memory cells is able to decrease the crosstalk or the coupling interference between the adjacent memory cells, thereby increasing the performance and the reliability of the 3D memory device 100.

After forming the isolation structures 127 between the adjacent memory cells, the sacrificial layers 114 are subsequently replaced with conductive layers 118 by a replacement process, which will be described in details in FIG. 8A to FIG. 10A and FIG. 8B to FIG. 10B.

Figures 8A, 8B:
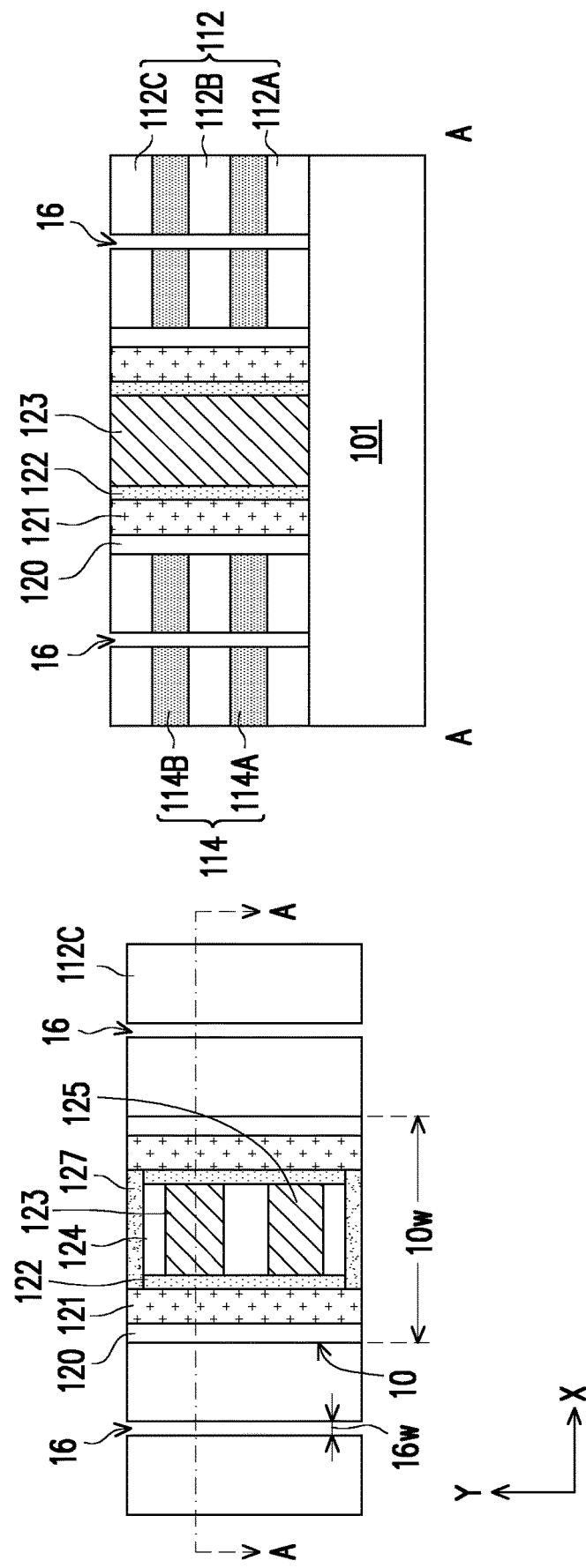

Referring to FIG. 8A and FIG. 8B, slits 16 are formed in the layer stack 110. In the illustrated embodiment, the slits 16 penetrate through the layer stack 110 and expose the underlying structure 101. In another embodiment, the slits 16 extend through some but not all layers of the layer stack 110. For example, the slits 16 may extend through all of the sacrificial layers 114 and expose the bottommost dielectric layer 112A. In some embodiments, the slits 16 may be formed by using acceptable photolithography and etching techniques, such as with an etching process that is selective to the layer stack 110 (e.g., etches the materials of the dielectric layers 112 and the sacrificial layers 114 at a faster rate than the material of the underlying structure 101). The etching may be any acceptable etch process, and in some embodiments, may be similar to the etch used to form the trench 10 discussed with respect to FIG. 3A and FIG. 3B.

In some embodiments, the slits 16 are disposed aside the ferroelectric layer 120 (or trench 10), and extend along the Y direction in the top view of FIG. 8A. However, the embodiments of the present disclosure are not limited thereto, in other embodiments, the slits 16 may extend along a X direction in the top view. In addition, the slits 16 may have a width 16w less than a width 10w of the trench 10, so as to save the horizontal chip area. Although the shape of the slits 16 illustrated in the top view of FIG. 8A is a straight-line shape, the embodiments of the present disclosure are not limited thereto. In alternative embodiments, the shape of the slits 16 in the top view may be a plurality of dots or islands separated from each other and distributed between adjacent memory cells. Herein, the shape and the position of the slits are not limited thereto, as long as the slits can be used for the subsequent replacement process.

Figure 9B:
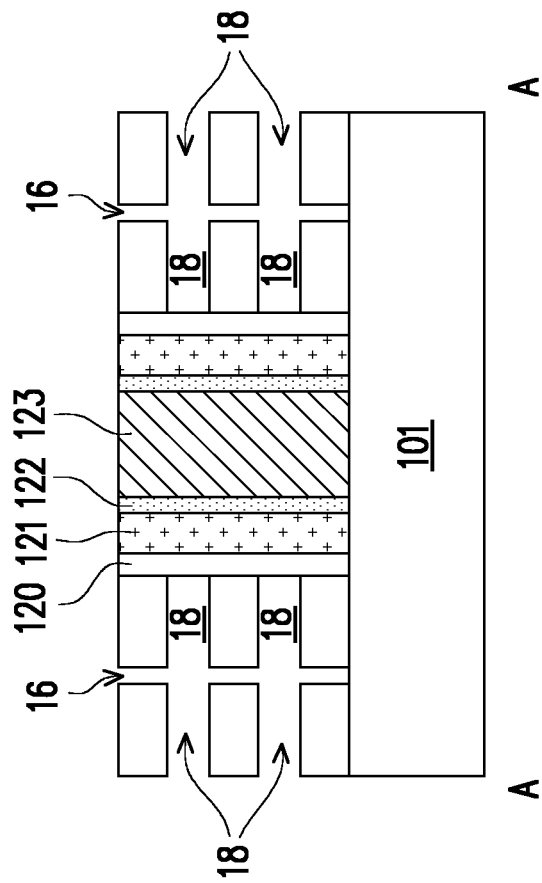
Figure 9A:
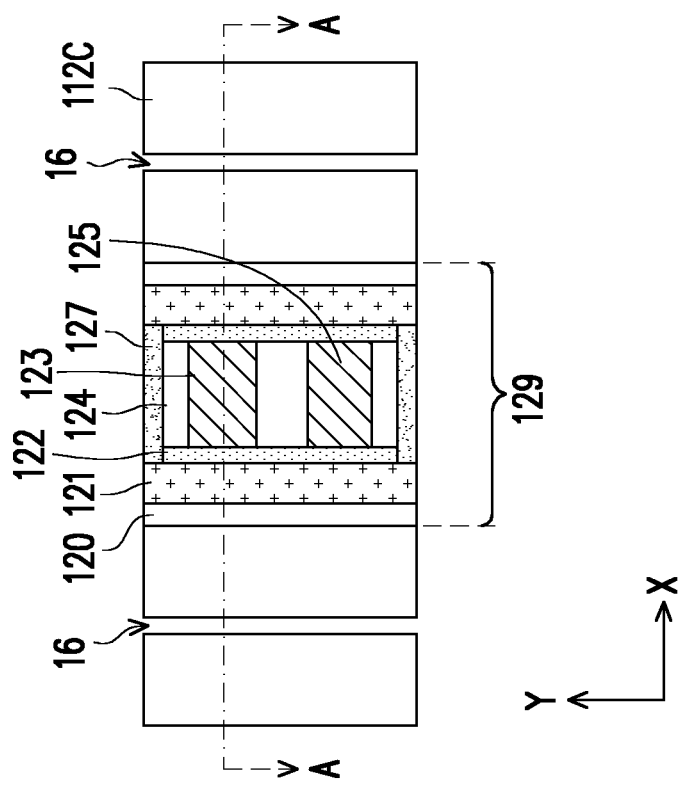

Referring to FIG. 9A and FIG. 9B, the sacrificial layers 114 are removed to form a plurality of gaps 18 between the dielectric layers 112. In some embodiments, a method for removing the sacrificial layers 114 includes a wet etching process or an isotropic etching process. Since the underlying structure 101, the dielectric layers 112, and the ferroelectric layer 120 may have sufficient etching selectivity with respect to the sacrificial layers 114, the sacrificial layers 114 can be selectively removed during such wet or isotropic etching process. As shown in FIG. 9B, after removing the sacrificial layers 114, surfaces of the dielectric layers 112 and the ferroelectric layer 120 are currently exposed by the gaps 18. In addition, since a composite structure 129 constituted of the ferroelectric layer 120, the buffer layer 121, the channel layer 122, the dielectric pillar 124, and the S/D region 123, 125 are connected to the dielectric layers 112, the composite structure 129 can provide support for the dielectric layers 112, and prevent the dielectric layers 112 from collapse after removal of the sacrificial layers 114. Further, a periphery region surrounding an array region with a memory array has some portions of the sacrificial layers 114 that are not removed by the said replacement process. Therefore, in addition to the composite structure 129, some portions of the sacrificial layers 114 in the periphery region also provides further support to prevent the dielectric layers 112 in the array region from collapse.

Referring to FIG. 10A and FIG. 10B, a plurality of conductive layers 118 (including 118A, 118B) are formed in the gaps 18 between adjacent dielectric layers 112, so as to accomplish the 3D memory device 100. In some embodiments, the conductive layers 118 are formed by depositing a conductive material to fill in the gaps 18, cover the upper surface of the topmost dielectric layer 112C, and cover the sidewalls of the slits 16; and removing a portion of the conductive material covering the upper surface of the topmost dielectric layer 112C and the sidewalls of the slits 16. The remaining portions of the conductive material are filled into the gaps 18 to form the conductive layers 118. The conductive material may include copper, tungsten, cobalt, aluminum, tungsten nitride, rhuthenium, silver, gold, rhodium, molybdenum, nickel, cadmium, zinc, alloys thereof, combinations thereof, and the like, and may be formed by a suitable deposition method such as CVD, PVD, ALD, plating, or the like. In some alternative embodiments, a barrier layer may be formed between the conductive layer 118 and the adjacent dielectric layer 112, so as to prevent the metal elements of the conductive layer 118 from diffusing to the adjacent dielectric layers 112. The barrier layer may also provide the function of increasing the adhesion between the conductive layer 118 and the adjacent dielectric layer 112, and may be referred to as glue layers in some examples. The barrier layer may include a metal nitride, such as titanium nitride, tantalum nitride, molybdenum nitride, zirconium nitride, hafnium nitride, or the like. In some other embodiments, the barrier layer and the conductive layers 118 have different conductive materials. For example, the conductive layers 118 are made of tungsten, and the barrier layer is made of titanium nitride.

Figure 10C:
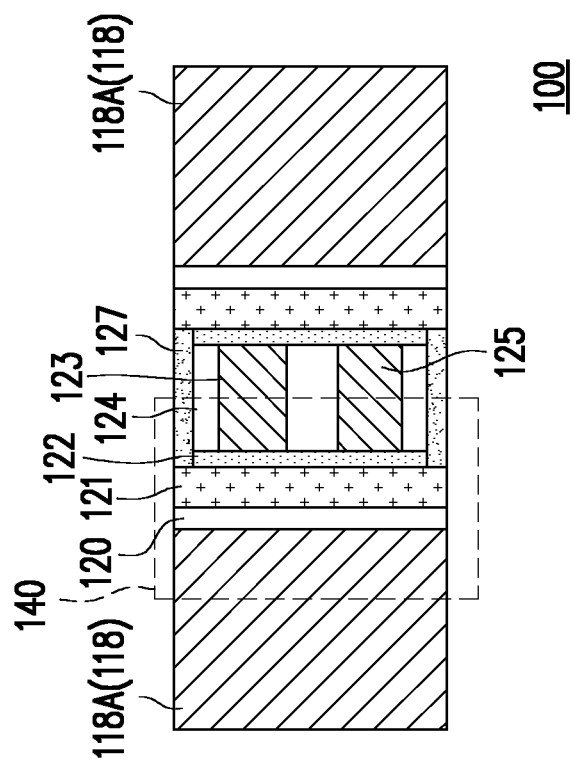
FIG. 10C is a plan view along a cross-section B-B of FIG. 10B.

FIG. 10C illustrates a plan view along a cross-section B-B of FIG. 10B. As shown in FIG. 10C, the dashed box in FIG. 10C illustrates a memory cell 140 of the 3D memory device 100. The 3D memory device 100 may include a plurality of such memory cell. In detail, the memory cell 140 includes a pair of conductive pillars 123 and 125, the channel layer 122, the buffer layer 121, the ferroelectric layer 120, and the conductive layer 118. The channel layer 122 is disposed on the same side of the conductive pillars 123 and 125. The buffer layer 121 is disposed on the channel layer 122. The ferroelectric layer 120 is disposed between the buffer layer 121 and the conductive layer 118. In the embodiment, the conductive layers 118 may be referred to as control gates (hereinafter called control gates 118), and the conductive pillars 123 and 125 may be referred to as S/D regions (hereinafter called S/D regions 123 and 125). Since the ferroelectric layer 120 is disposed between the control gate 118 and the S/D regions 123 and 125, the memory cell 140 may be referred to as a ferroelectric field effect transistor (FeFET) memory cell.

In some embodiments, the memory cell 140 can be programmed (e.g., written and/or read) through the control gate 118 and the S/D regions 123 and 125 of the transistor of the memory cell 140.

To perform a write operation on a particular memory cell, e.g., the memory cell 140, a write voltage is applied across a portion of the ferroelectric layer 120 corresponding to the memory cell 140. The write voltage may be applied, for example, by applying a first voltage to the control gate 118 of the memory cell 140, and applying a second voltage to the S/D regions 123 and 125. The voltage difference between the first voltage and the second voltage sets the polarization direction of the ferroelectric layer 120. Depending on the polarization direction of the ferroelectric layer 120, the threshold voltage $V_T$ of the corresponding transistor of the memory cell 140 can be switched from a low threshold voltage $V_L$ to a high threshold voltage $V_H$, or vice versa. The threshold voltage value ($V_L$ or $V_H$) of the transistor can be used to indicate a bit of "0" or a "1" stored in the memory cell.

To perform a read operation on the memory cell 140, a read voltage, which is a voltage between the low threshold voltage $V_L$ and the high threshold voltage $V_H$, is applied to the transistor, e.g., between the control gate 118 and the S/D region 123. Depending on the polarization direction of the ferroelectric layer 120 (or the threshold voltage of the transistor), the transistor of the memory cells 140 may or may not be turned on. As a result, when a voltage is applied, e.g., at the S/D region 123, an electrical current may or may not flow between the S/D regions 123 and 125 through the channel layer 122. The electrical current may thus be detected to determine the digital bit stored in the memory cell.

Figure 11B:
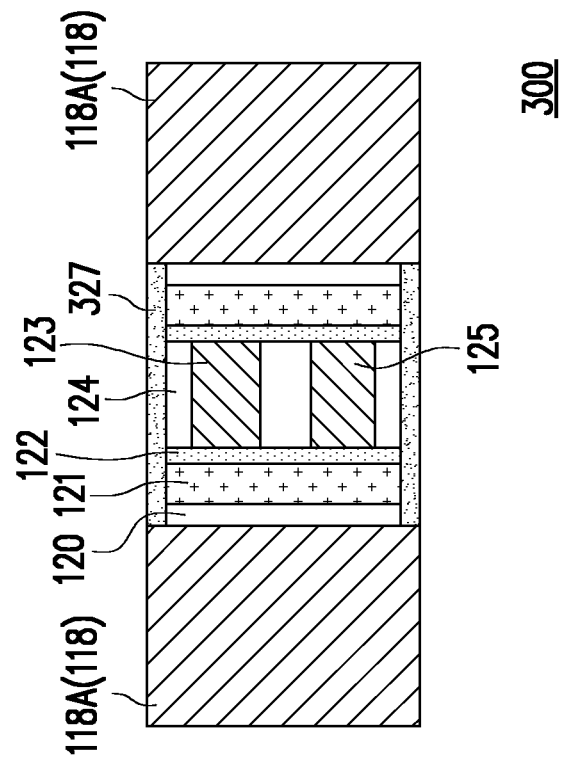
FIG. 11A and FIG. 11B are plan views of a 3D memory device in accordance with various embodiments.
Figure 11A:
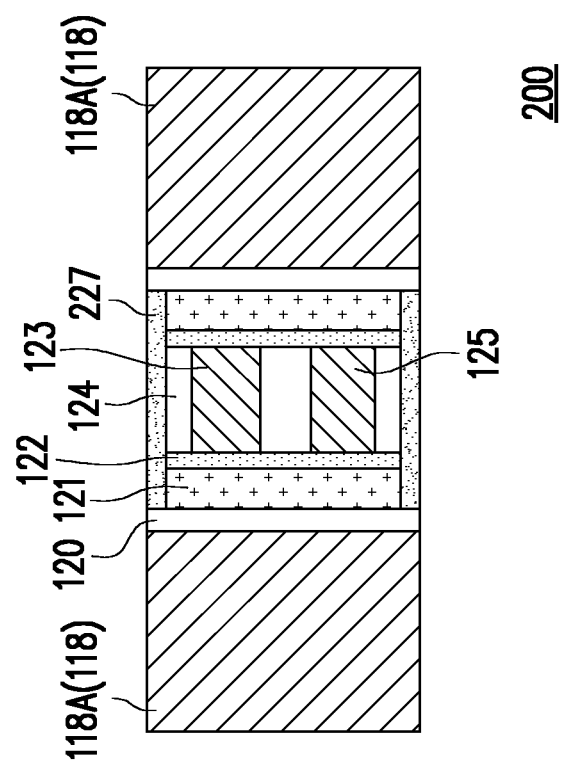

FIG. 11A and FIG. 11B are plan views of a 3D memory device in accordance with various embodiments.

Referring to FIG. 11A, a 3D memory device 200 is similar to the 3D memory device 100 of FIG. 10C, but the isolation structures 227 of the 3D memory device 200 further extend to cut off the buffer layers 121, so that the isolation structures 227 may be in contact with the ferroelectric layer 120. In this case, the isolation structures 227 of the 3D memory device 200 may provide a better isolation between adjacent memory cells.

Referring to FIG. 11B, a 3D memory device 300 is similar to the 3D memory device 100 of FIG. 10C, but the isolation structures 327 of the 3D memory device 300 further extend to cut off the buffer layers 121 and the ferroelectric layer 120, so that the isolation structures 327 may be in contact with the conductive layer 118A. In this case, the isolation structures 327 of the 3D memory device 300 may provide further better isolation between adjacent memory cells.

Figure 12:
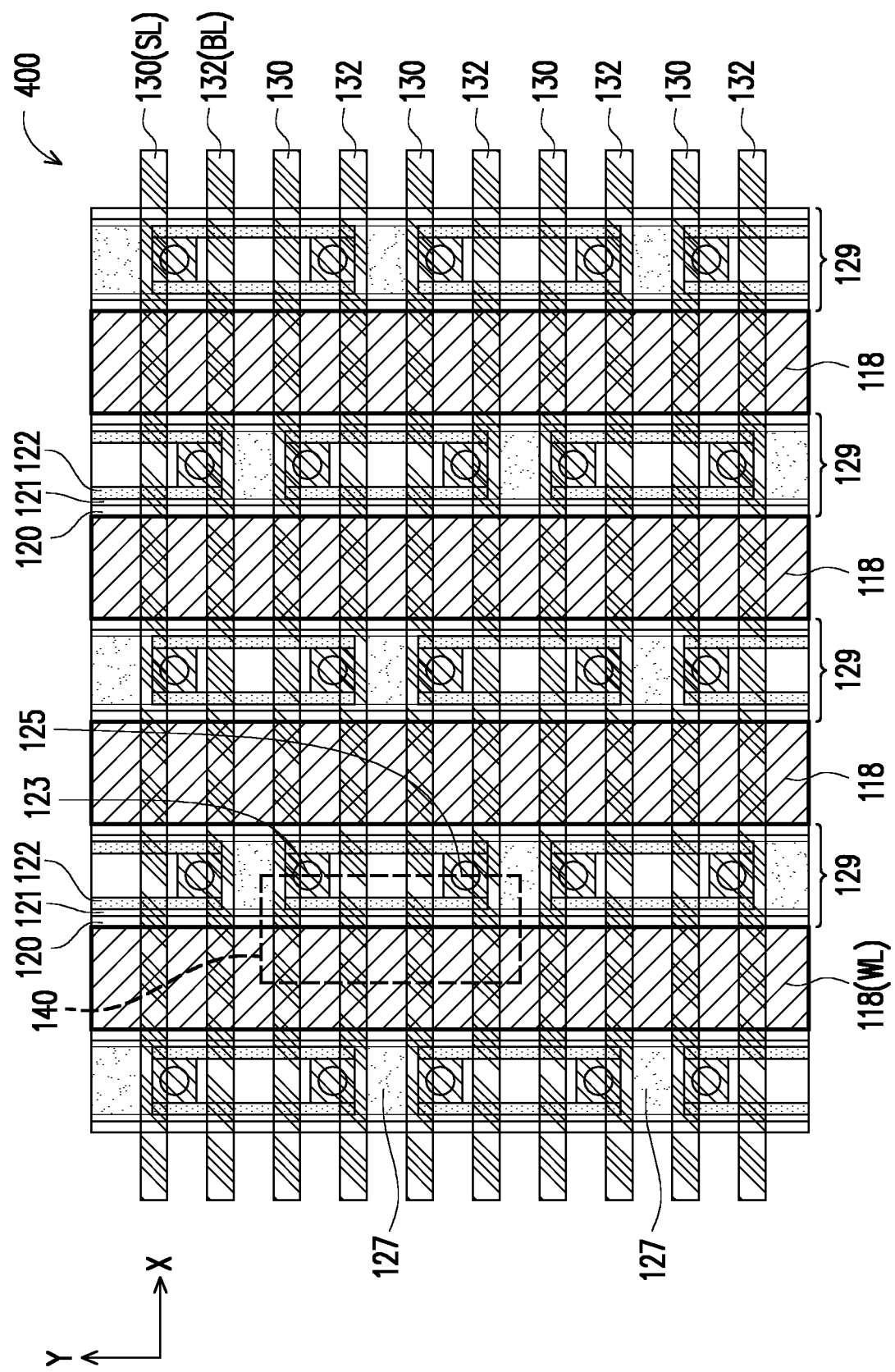
FIG. 12 is a top view of a memory array in accordance with some embodiments.
Figure 13:
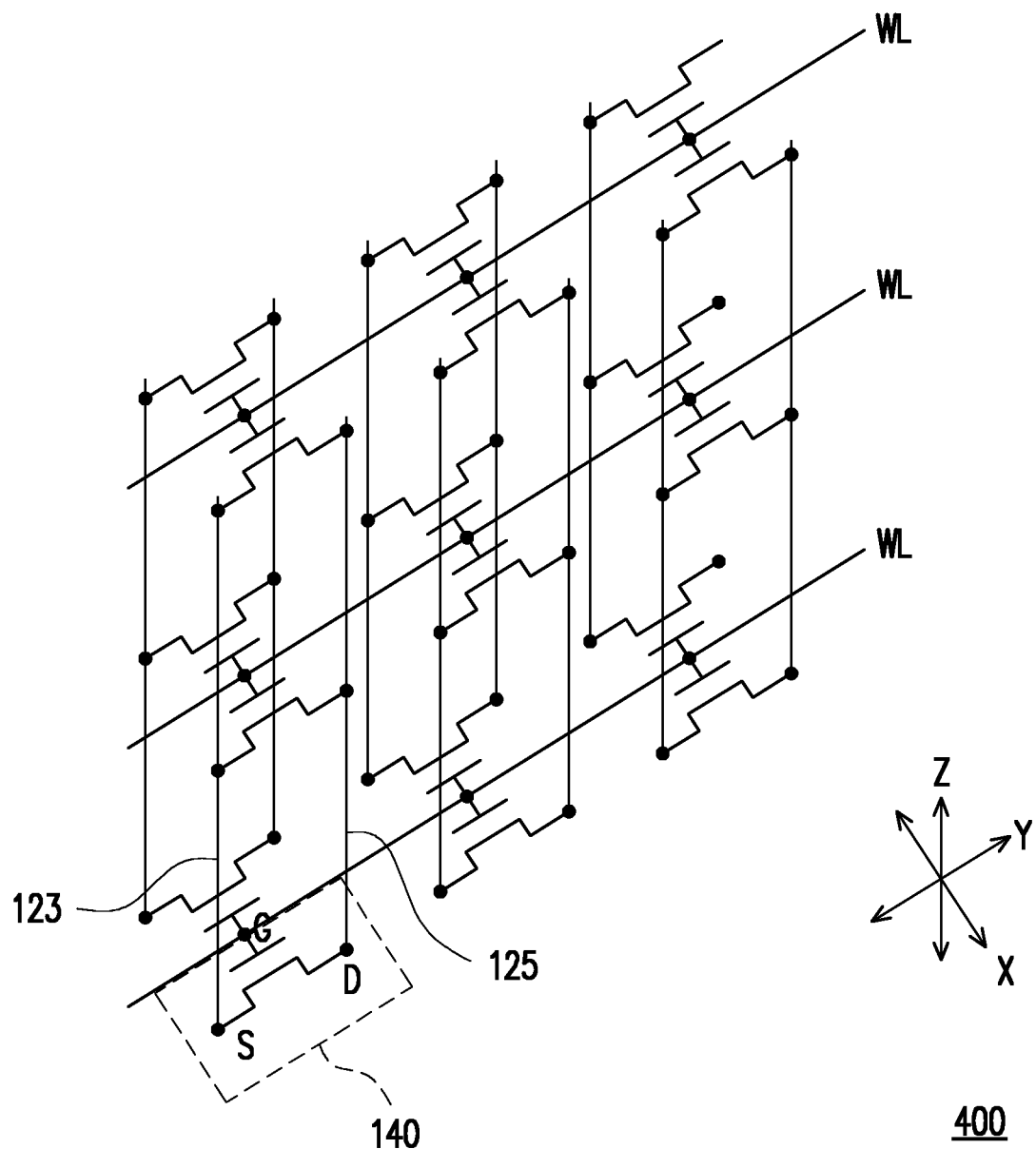
FIG. 13 is a circuit diagram of the memory array of FIG. 12.

FIG. 12 illustrates an example of a portion of a memory array 400 in accordance with some embodiments. FIG. 13 is a circuit diagram of the memory array 400 of FIG. 12. In some embodiments, the memory array 400 is a NOR memory array or architecture. In the following embodiment, the NOR memory array is taken for example for illustration, but the embodiments of the present disclosure are not limited thereto.

Referring to FIG. 12, the memory array 400 includes a plurality of memory cells 140, which may be arranged in a grid of rows and columns. To avoid clutter, besides the memory cell 140, the other memory cells are not marked by dashed boxes. In some embodiments, the memory cells 140 in different column may be arranged in a staggered configuration as shown in FIG. 12. However, the embodiments of the present disclosure are not limited thereto, in other embodiments, the memory cells 140 in different column may be arranged in the same or aligned configuration. In addition, the components and the configuration of the memory cells 140 are detail illustrated in the above embodiment, and thus details thereof are omitted herein.

In the top view of FIG. 12, the conductive layers 118 and the composite structures 129 extend along the Y direction, and are arranged alternately along the X direction. The composite structure 129 in the same column may include a plurality of composite pillar structures separated from each other by the isolation structures 127. In some embodiments, each of the composite pillar structures include a pair of conductive pillars 123 and 125. The memory array 400 further includes a plurality of source lines 130 and a plurality of bit lines 132 disposed on the memory cells 140. In the top view of FIG. 12, the source lines 130 and the bit lines 132 extend along the X direction, and are arranged alternately along the Y direction. In detail, one of the source lines 130 is electrically connected to the corresponding conductive pillars 123 in odd or even columns, and one of the bit lines 132 is electrically connected to the corresponding conductive pillars 125 in even or odd columns.

From the perspective of the circuit diagram of FIG. 13, each memory cell 140 may include a transistor with the ferroelectric layer 120 and the buffer layer 121 (as shown in FIG. 12). In some embodiments, the conductive layers 118 in each memory cell 140 shown in FIG. 12 may be functioned as word lines WL as shown in FIG. 13. The word lines WL are arranged along a Z direction. Each word line WL connects gate terminals G of two laterally adjacent column of the memory cells 140 in the same XY plane. On the other hands, the memory cells 140 in a same horizontal row of the memory array 400 may share a common word line. In some embodiments, the word lines WL are electrically connected to the electrical components 104 (e.g., the S/D regions of the transistors) in the FEOL through the conductive features 105 in the interconnect structure of the underlying structure 101 (FIG. 1). In this case, the electrical components 104 may control the switch of the gate terminals G. In addition, the conductive pillar 123 in each memory cell 140 shown in FIG. 12 is connected to the source terminals S of the memory cells 140 stacked along the vertical direction Z as shown in FIG. 13. Similarly, the conductive pillar 125 in each memory cell 140 shown in FIG. 12 is connected to the drain terminals D of the memory cells 140 stacked along the vertical direction Z as shown in FIG. 13. That is, the source terminals S of the stacked memory cells 140 are connected together by the conductive pillar 123, and the drain terminals D of the stacked memory cells 140 are connected together by the conductive pillar 125. In other words, the memory cells 140 in a same vertical column of the memory array 400 may share a common source line and a common bit line, so that channels of the memory cells 140 in a same vertical column of the memory array 400 are connected in parallel. Accordingly, the stacked memory cells 140 in the same vertical column may be regarded as being connected by a NOR configuration, and the 3D memory array 400 may be referred as a 3D NOR memory array.

FIG. 14A to FIG. 14D are cross-sectional views of a 3D memory device in accordance with some alternative embodiments.

Referring to FIG. 14A, a 3D memory device 500 is similar to the 3D memory device 100 of FIG. 10B, but the buffer layer 121 in FIG. 10B is replaced by a buffer layer 521 with a bi-layered structure. Specifically, the buffer layer 521 includes a first dielectric material 521a contacting the ferroelectric layer 120, and a second dielectric material 521b contacting the channel layer 122. In some embodiments, the first dielectric material 521a and the second dielectric material 521b have different dielectric constants. In the present embodiment, the first dielectric material 521a is the nitrogen-doped $Al_2O_3$ layer with a first nitrogen doping concentration, the second dielectric material 521b is the nitrogen-doped $Al_2O_3$ layer with a second nitrogen doping concentration, and the first nitrogen doping concentration is less than the second nitrogen doping concentration. The first nitrogen doping concentration may be in a range of 0% to 5%, and the second nitrogen doping concentration may be in a range of 5% to 7%. For example, the first dielectric material 521a is the $Al_2O_3$ layer with 4% nitrogen doping concentration, and the second dielectric material 521b is the $Al_2O_3$ layer with 6% nitrogen doping concentration. Further, the first dielectric material 521a may be the undoped or intrinsic $Al_2O_3$ layer with 0% nitrogen doping concentration, and the second dielectric material 521b may be the $Al_2O_3$ layer with 5% nitrogen doping concentration. In some alternative embodiments, the first dielectric material 521a may be a ZrO$_2$ layer, and the second dielectric material 521b may be a TiO$_2$ layer.

Referring to FIG. 14B, a 3D memory device 500a is similar to the 3D memory device 500 of FIG. 14A, but the first dielectric material 521a and the second dielectric material 521b in FIG. 14A are swapped to each other to form a buffer layer 521' of FIG. 14B. That is, the buffer layer 521' includes a second dielectric material 521b contacting the ferroelectric layer 120, and a first dielectric material 521a contacting the channel layer 122. The material and the configuration of the first dielectric material 521a and the second dielectric material 521b are detail illustrated in the above embodiment, and thus details thereof are omitted herein.

Referring to FIG. 14C, a 3D memory device 600 is similar to the 3D memory device 100 of FIG. 10B, but the buffer layer 121 in FIG. 10B is replaced by a buffer layer 621 with a triple-layered structure. Specifically, the buffer layer 621 includes a first dielectric material 621a contacting the ferroelectric layer 120, a third dielectric material 621c contacting the channel layer 122, and a second dielectric material 621b between the first and third dielectric materials 621a and 621c. In some embodiments, the first dielectric material 621a, the second dielectric material 621b, and the third dielectric material 621c have different dielectric constants. In the present embodiment, the first dielectric material 621a is the nitrogen-doped Al$_2$O$_3$ layer with a first nitrogen doping concentration, the second dielectric material 621b is the nitrogen-doped Al$_2$O$_3$ layer with a second nitrogen doping concentration, the third dielectric material 621c is the nitrogen-doped Al$_2$O$_3$ layer with a third nitrogen doping concentration, where the first nitrogen doping concentration is less than the second nitrogen doping concentration, and the second nitrogen doping concentration is less than the third nitrogen doping concentration. The first nitrogen doping concentration may be in a range of 0% to 5%, the second nitrogen doping concentration may be in a range of 5% to 7%, and the third nitrogen doping concentration may be in a range of 7% to 10%. For example, the first dielectric material 621a is the undoped or intrinsic Al$_2$O$_3$ layer with 0% nitrogen doping concentration, the second dielectric material 621b is the Al$_2$O$_3$ layer with 5% nitrogen doping concentration, and the third dielectric material 621c is the Al$_2$O$_3$ layer with 10% nitrogen doping concentration. In some alternative embodiments, the first dielectric material 621a may be an Al$_2$O$_3$ layer, the second dielectric material 621b may be a ZrO$_2$ layer, and the third dielectric material 621c may be a TiO$_2$ layer.

Referring to FIG. 14D, a 3D memory device 600a is similar to the 3D memory device 600 of FIG. 14C, but the first dielectric material 621a and the third dielectric material 621c in FIG. 14C are swapped to each other to form a buffer layer 621' of FIG. 14D. That is, the buffer layer 621' includes a third dielectric material 621c contacting the ferroelectric layer 120, a first dielectric material 621a contacting the channel layer 122, and a second dielectric material 621b between the first and third dielectric material 621a and 621c. The material and the configuration of the first, second, and third dielectric materials 621a, 621b, and 621c are detail illustrated in the above embodiment, and thus details thereof are omitted herein.

FIG. 15 to FIG. 21A are cross-sectional views of a method of forming a 3D memory device in accordance with a second embodiment. FIG. 16B is a top view of a 3D memory device of FIG. 16A. FIG. 21B is a plan view along a cross-section C-C of FIG. 21A. In some embodiments, the 3D memory device is a NAND memory device or the like. In the following embodiment, the NAND memory device is taken for example for illustration, but the embodiments of the present disclosure are not limited thereto.

Figure 15:
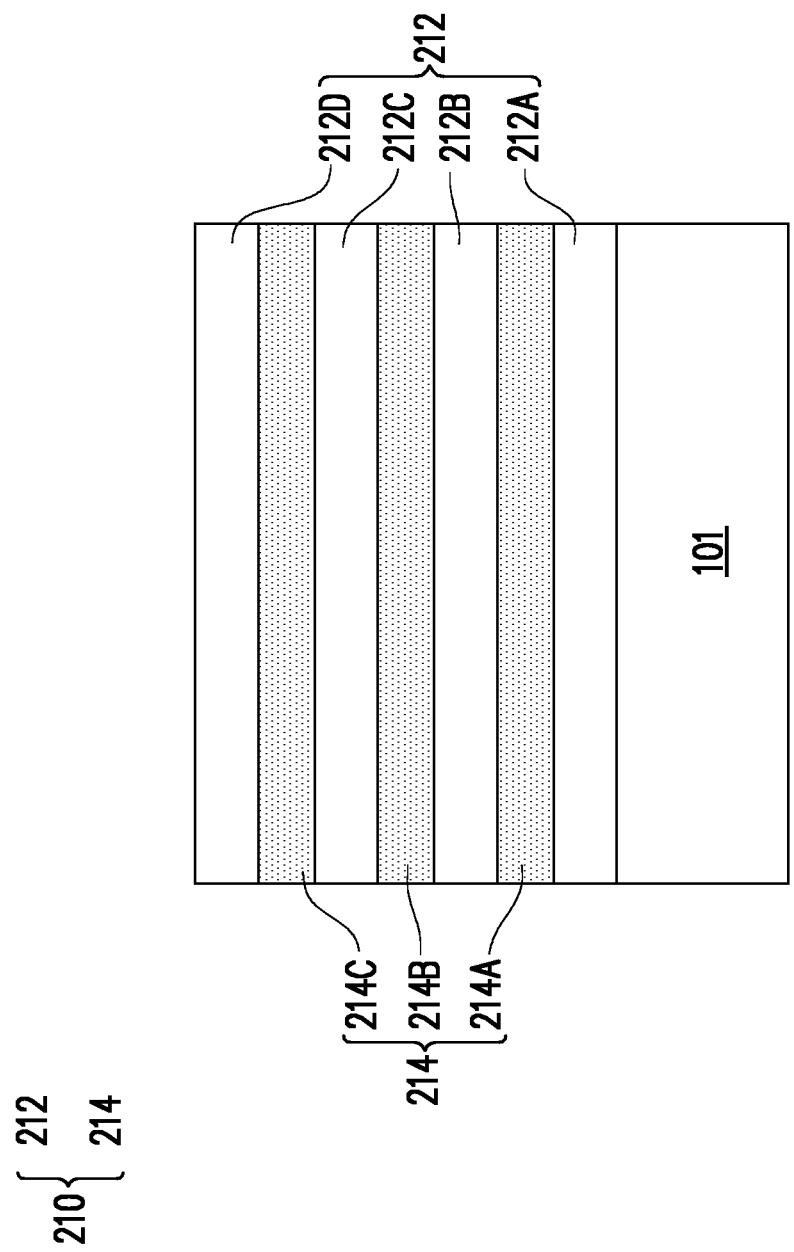
Figure 16:
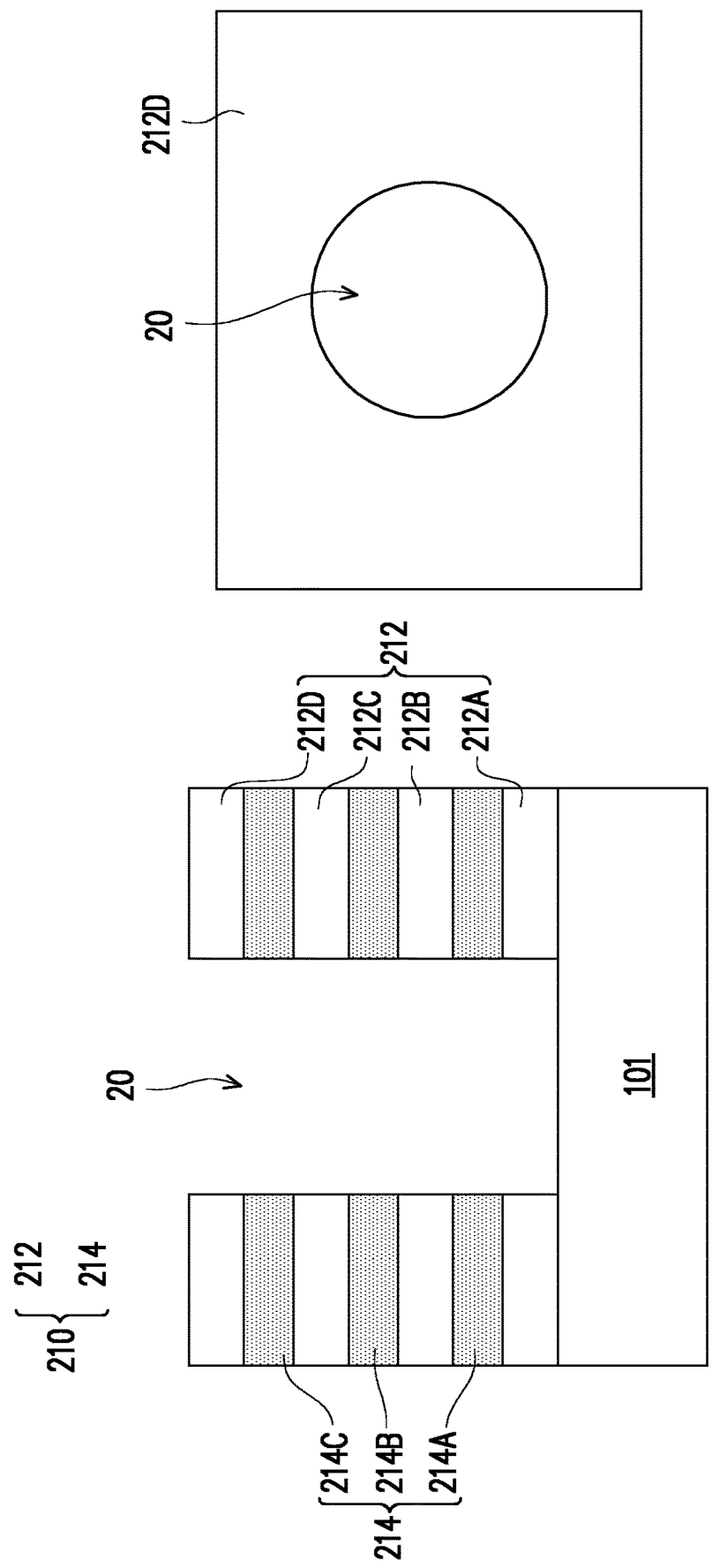

Referring to FIG. 15, a layer stack 210 is formed on the underlying structure 101. The material and the configuration of the underlying structure 101 are detail illustrated in the above embodiment, and thus details thereof are omitted herein. In detail, the layer stack 210 may include a plurality of dielectric layers 212A, 212B, 212C, 212D and a plurality of sacrificial layers 214A, 214B, 214C stacked alternately on the underlying structure 101. Although only four dielectric layers 212A, 212B, 212C, 212D, and three sacrificial layers 214A, 214B, 214C are illustrated in FIG. 15, the embodiments of the present disclosure are not limited thereto. In other embodiments, the number of the dielectric and sacrificial layers can be adjusted as needed. For example, the number of the dielectric layers may be 8, 16, 32, or more layers, and the number of the sacrificial layers may be 8, 16, 32, or more layers. Hereinafter, the dielectric layers 212A, 212B, 212C, 212D are collectively referred to as the dielectric layers 212, and the sacrificial layers 214A, 214B, 214C are collectively referred to as the sacrificial layers 214. The material and the forming method of the dielectric layers 212 and the sacrificial layers 214 are similar to the material and the forming method of the dielectric layers 112 and sacrificial layers 114, and are detail illustrated in the above embodiment, and thus details thereof are omitted herein.

Referring to FIG. 16A and FIG. 16B, an opening 20 is formed in the layer stack 210 to expose the underlying structure 101. That is, the opening 20 penetrate through the layer stack 210 and the underlying structure 101 is exposed at the bottom of the opening 20. In addition, the opening 20 exposes sidewalls of the dielectric layers 212 and sidewalls of the sacrificial layers 214. It is noted that although only one opening 20 is illustrated in FIG. 16A and FIG. 16B, the embodiments of the present disclosure are not limited thereto. In other embodiments, one or more openings may be formed to penetrate through the layer stack 210. Further, the shape of the opening 20 is not limit to being circular. That is, the shape of the opening 20 may be elliptical, rectangular, polygonal, or a combination thereof.

Figure 17:
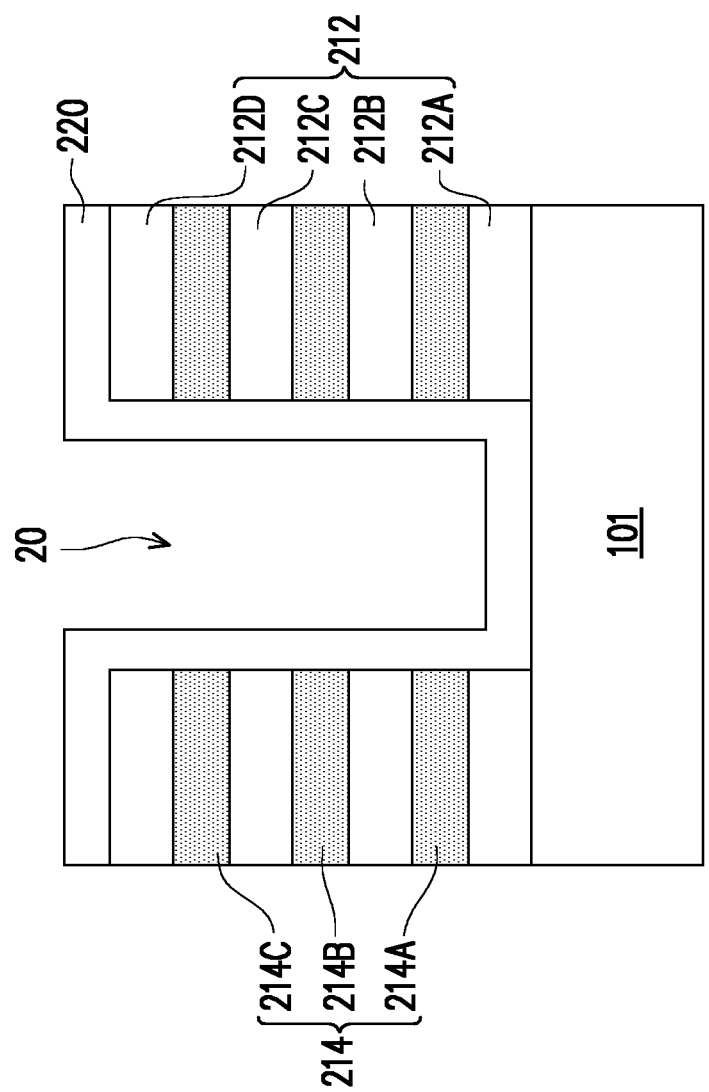

Referring to FIG. 17, a ferroelectric material 220 is formed to conformally cover the bottom and sidewalls of the opening 20, and further cover the upper surface of the topmost dielectric layer 212D. The ferroelectric material 220 may have a material that is capable of switching between two different polarization directions by applying an appropriate voltage differential across the ferroelectric material 220. For example, the polarization of the ferroelectric material 220 may change due to an electric field resulting from applying the voltage differential.

In some embodiments, the ferroelectric material 220 may include HZO, HSO, HfSiO, HfLaO, HfO$_2$, HfZrO$_2$, ZrO$_2$, or HfO$_2$ doped by La, Y, Si, or Ge, and may be formed by PVD, CVD, ALD, or the like. In some alternative embodiments, the ferroelectric material 220 may be a high-k dielectric material, such as a hafnium (Hf) based dielectric material, or the like. For example, the ferroelectric material 220 is a hafnium-comprising compound, such as hafnium zirconium oxide (HfZnO), hafnium aluminum oxide (HfAlO), hafnium lanthanum oxide (HfLaO), hafnium cerium oxide (HfCeO), hafnium oxide (HfO), hafnium gadolinium oxide (HfGdO), hafnium silicon oxide (HfSiO), hafnium zirconium lanthanum oxide (HfZrLaO), hafnium zirconium gadolinium oxide (HfZrGdO), hafnium zirconium yttrium oxide (HfZrYO), hafnium zirconium cerium oxide (HfZrCeO), hafnium zirconium strontium oxide (HfZrSrO), or the like. In addition, the hafnium-comprising compound may further be doped by some dopants, such as La, Y, Si, Ge, Ce, Gd, Sr, or the like, or a combination thereof. By doping these dopants in the hafnium-comprising compound, an orthorhombic lattice structure can be achieved in the ferroelectric material 220. In some embodiments, the hafnium-comprising compound with the orthorhombic lattice structure has a desired ferroelectric property to achieve the switchable performance of the ferroelectric layer in the memory device. In addition, by including the dopants, an orthorhombic lattice structure in the ferroelectric material 220 may be achieved relatively easily (e.g., at a lower temperature), and the ferroelectric material 220 may be formed within the relatively low thermal budget of BEOL processes (e.g., at a temperature that does not damage front end of line (FEOL) features, such as the electrical components in the underlying structure 101).

Figure 18B:
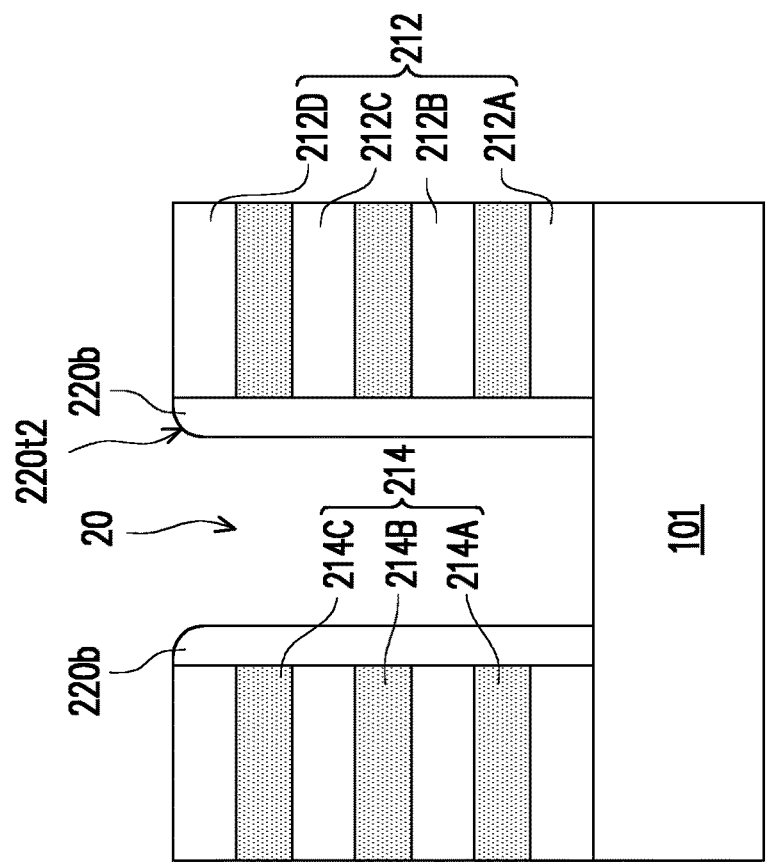
Figure 18A:
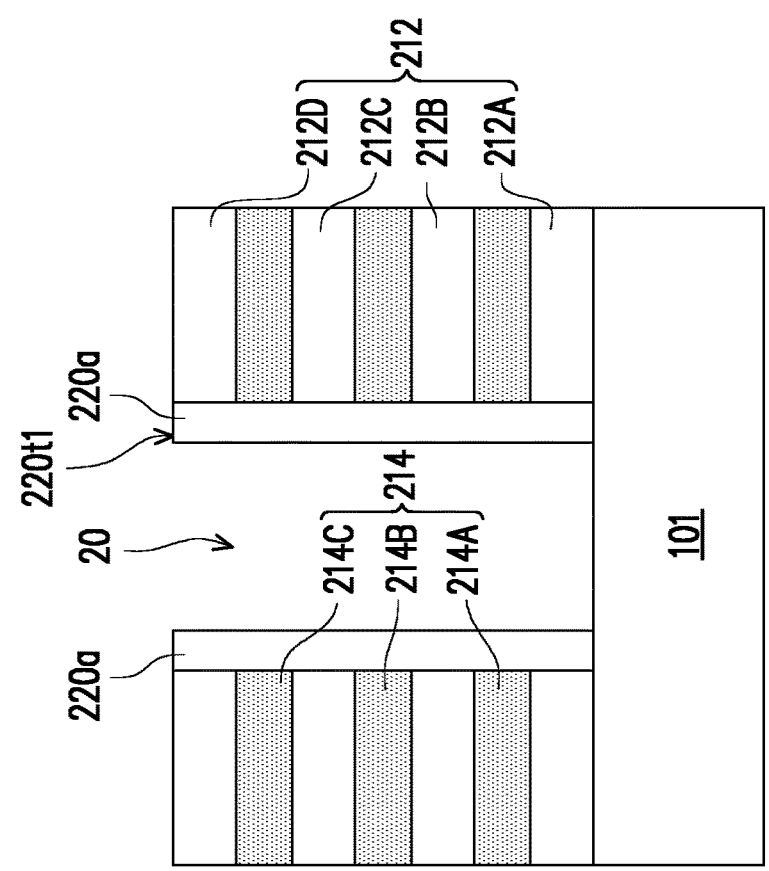

Referring to FIG. 18A and FIG. 18B, performing an anisotropic etching process to remove the ferroelectric material 220 on the bottom of the opening 20 and on the upper surface of the topmost dielectric layer 212D. In this case, a ferroelectric layer 220a is formed to cover the sidewall of the opening 20, and the ferroelectric layer 220a may have a flat top surface 220t1, as shown in FIG. 18A. In some alternative embodiments, the ferroelectric layer 220b may have a rounded or curved top surface 220t2 adjacent to the topmost dielectric layer 212D, as shown in FIG. 18B.

Figure 19:
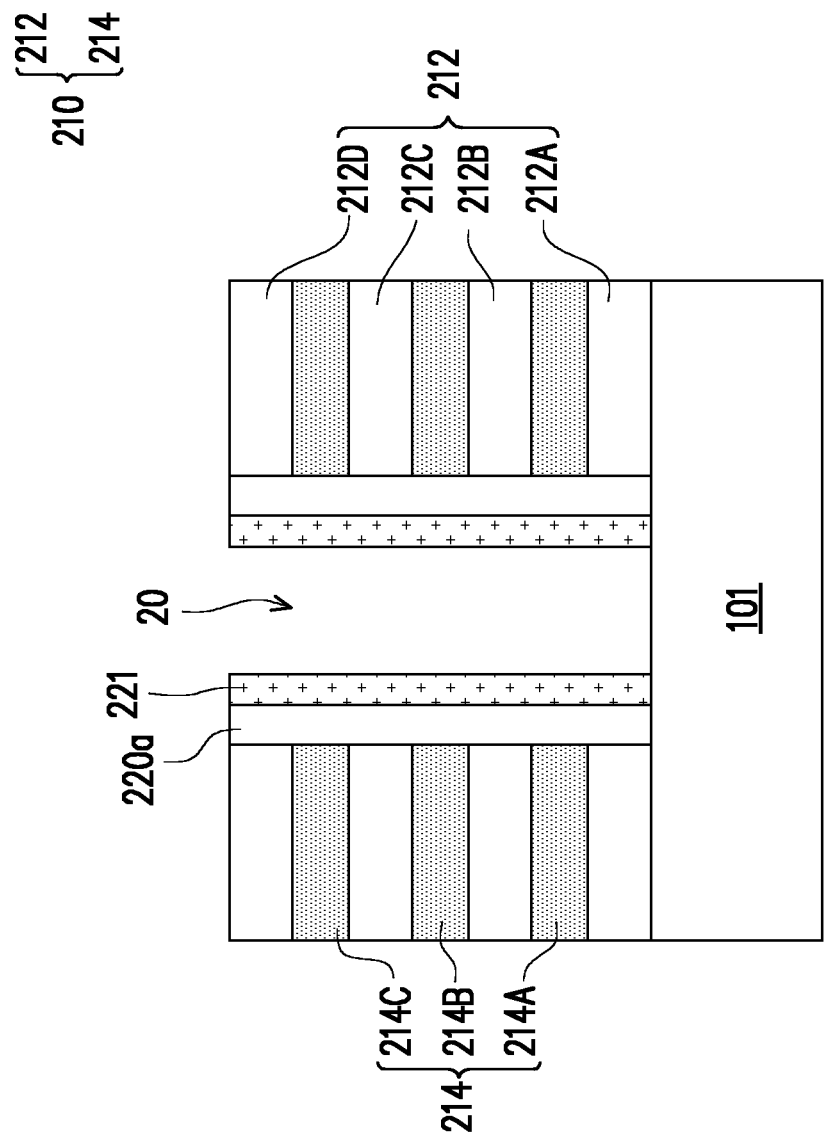

The structure of FIG. 18A is taken for example for illustration in the following processes. Referring to FIG. 19, a buffer layer 221 is formed in the opening 20 to cover the ferroelectric layer 220a. The material and the forming method of the buffer layer 221 are similar to the material and the forming method of the buffer layer 121, and are detail illustrated in the above embodiment, and thus details thereof are omitted herein. In addition, the buffer layer 221 may include a single-layered structure (as shown in FIG. 19), a bi-layered structure (as shown in FIG. 14A and FIG. 14B), a triple-layered structure (as shown in FIG. 14C and FIG. 14D), or a multi-layered structure.

Figure 20:
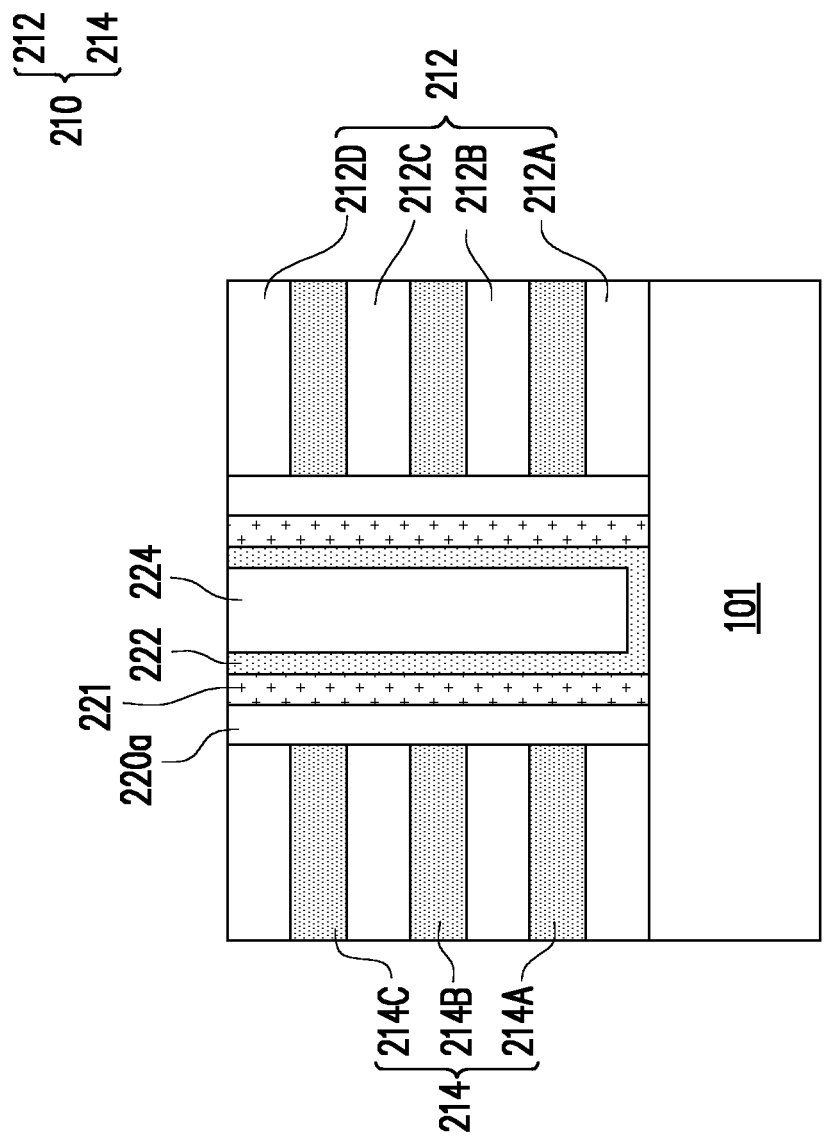

Referring to FIG. 20, a channel layer 222 is formed in the opening 20 to cover the buffer layer 121 and further cover the bottom of the opening 20. Next, a dielectric pillar 224 is formed on the channel layer 222 in the opening 20. In some embodiments, the channel layer 222 and the dielectric pillar 224 are formed by depositing a channel material that conformally covers the bottom of the opening 20, the sidewall of the buffer layer 221, and further covers the upper surface of the topmost dielectric layer 212D; filling in the opening 20 with a dielectric material; performing a planarization process, such as CMP process, to remove excessive portions of the dielectric material and the channel material from the upper surface of the topmost dielectric layer 212D. In this case, the channel layer 222 is U-shaped in a cross-sectional view of FIG. 20 to wrap the sidewalls and bottom surface of the dielectric pillar 224. The materials of the channel layer 222 and the dielectric pillar 224 are similar to the materials of the channel layer 122 and the dielectric pillar 124, and are detail illustrated in the above embodiment, and thus details thereof are omitted herein. That is, the overlying structure on the underlying structure 101 may be embedded in the interconnect structure of the BEOL. In such embodiment, the channel layer 222 may be disposed between any two metal lines in the interconnect structure. For example, the bottom 222b of the channel layer 222 may be disposed on or connected to the metal n (Mn) in the interconnect structure, and the top 222t of the channel layer 222 may be disposed below or connected to the metal n+1 (Mn+1) in the interconnect structure.

Figures 21A, 21B:
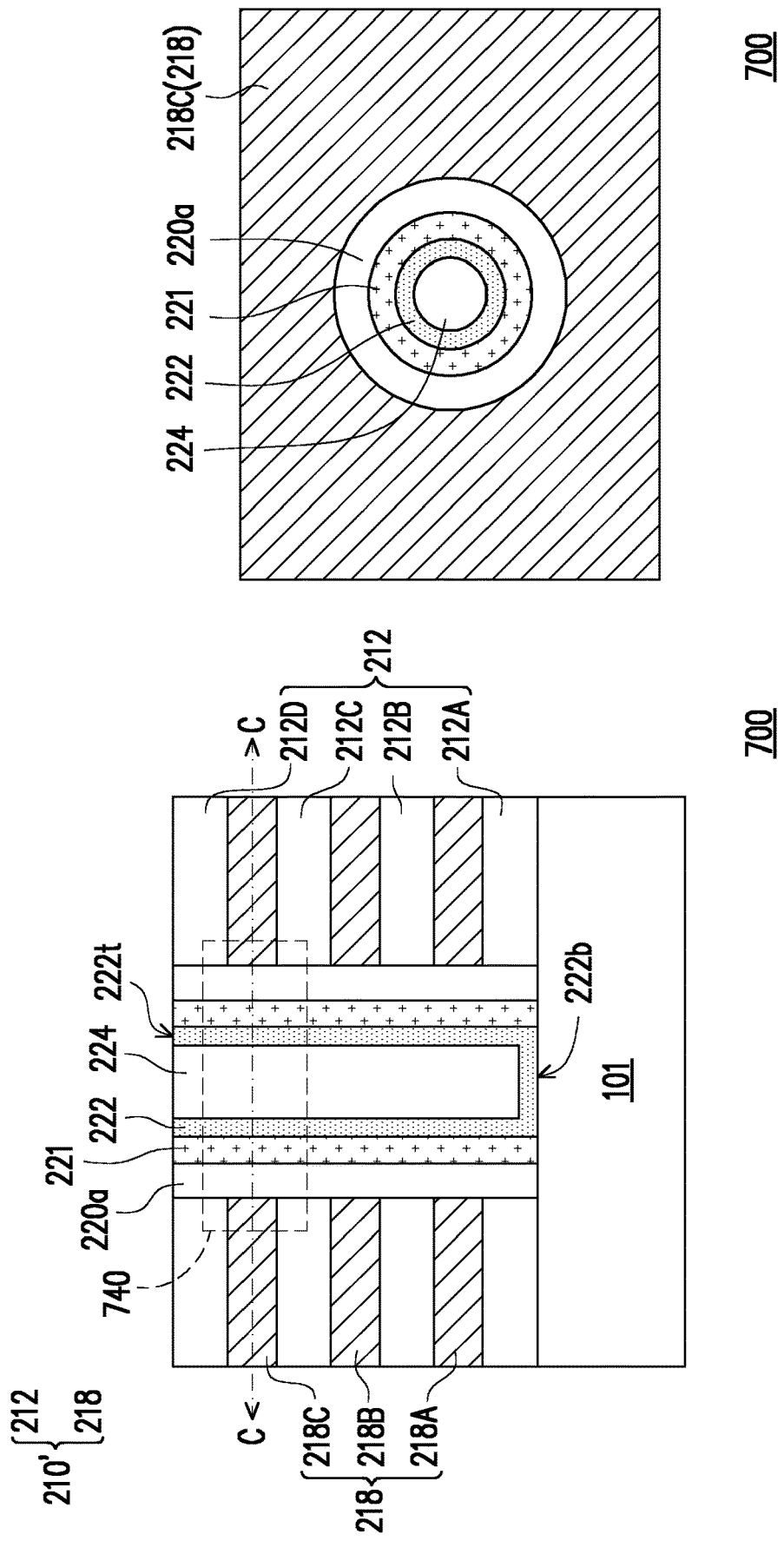

Referring to FIG. 21A and FIG. 21B, the sacrificial layers 214 (as shown in FIG. 20) are replaced with conductive layers 218 by a replacement process, the steps have been described in details in FIG. 8A to FIG. 10A and FIG. 8B to FIG. 10B, and thus details thereof are omitted herein. After performing the replacement process, the conductive layers 218 (including 218A, 218B, 218C) are formed in the gaps between adjacent dielectric layers 212, so as to accomplish a 3D memory device 700. Specifically, the 3D memory device 700 may include a layer stack 210' disposed on the underlying structure 101, the dielectric pillar 224 penetrating through the layer stack 210', the channel layer 222 wrapping the dielectric pillar 224, the ferroelectric layer 220a disposed between the channel layer 222 and the layer stack 210', and the buffer layer 221 disposed between the ferroelectric layer 220a and the channel layer 222. In the top view of FIG. 21B, the channel layer 222 wraps (e.g., encircles) the dielectric pillar 224, the buffer layer 221 wraps the channel layer 222, the ferroelectric layer 220a wraps the buffer layer 221, and the conductive layer 218 wraps the ferroelectric layer 220a.

As shown in FIG. 21A, the dashed box in FIG. 21A illustrates a memory cell 740 of the 3D memory device 700. The 3D memory device 700 may include a plurality of such memory cell. In detail, the memory cell 740 includes the channel layer 222, the buffer layer 221, the ferroelectric layer 220a, and the conductive layer 218. The buffer layer 221 is disposed between the channel layer 222 and the ferroelectric layer 220a. The ferroelectric layer 220a is disposed between the buffer layer 221 and the conductive layer 218. In the embodiment, the conductive layers 218 may be referred to as control gates (hereinafter called control gates 218). The channel layer 222 has a top 222t and a bottom 222b opposite to the top 222t. The top 222t of the channel layer 222 may be electrically connected to the bit line, and the bottom 222b of the channel layer 222 may be electrically connected to the source line, or vice versa. That is, the overlying structure on the underlying structure 101 may be embedded in the interconnect structure of the BEOL. In such embodiment, the channel layer 222 may be disposed between any two metal lines in the interconnect structure. For example, the bottom 222b of the channel layer 222 may be disposed on or connected to the metal n (Mn) in the interconnect structure, and the top 222t of the channel layer 222 may be disposed below or connected to the metal n+1 (Mn+1) in the interconnect structure. Since the ferroelectric layer 220a is disposed between the control gate 218 and the channel layer 222, the memory cell 740 may be referred to as a ferroelectric field effect transistor (FeFET) memory cell.

In some embodiments, the memory cell 740 can be programmed (e.g., written and/or read) through the control gate 218 and the channel layer 222 of the transistor of the memory cell 740.

To perform a write operation on a particular memory cell, e.g., the memory cell 740, a write voltage is applied across a portion of the ferroelectric layer 220a corresponding to the memory cell 740. The write voltage may be applied, for example, by applying a first voltage to the control gate 218 of the memory cell 740, and applying a second voltage to the bit line connecting the top 222t of the channel layer 222 and the source line connecting the bottom 222b of the channel layer 222. The voltage difference between the first voltage and the second voltage sets the polarization direction of the ferroelectric layer 220a. Depending on the polarization direction of the ferroelectric layer 220a, the threshold voltage $V_T$ of the corresponding transistor of the memory cell 740 can be switched from a low threshold voltage $V_L$ to a high threshold voltage $V_H$, or vice versa. The threshold voltage value ($V_L$ or $V_H$) of the transistor can be used to indicate a bit of "0" or a "1" stored in the memory cell.

To perform a read operation on the memory cell 740, a read voltage, which is a voltage between the low threshold voltage $V_L$ and the high threshold voltage $V_H$, is applied to the transistor, e.g., between the control gate 218 and the source line connecting the bottom 222b of the channel layer 222. Depending on the polarization direction of the ferroelectric layer 220a (or the threshold voltage of the transistor), the transistor of the memory cells 740 may or may not be turned on. As a result, when a voltage is applied, an electrical current may or may not flow through the channel layer 222. The electrical current may thus be detected to determine the digital bit stored in the memory cell.

Figure 22:
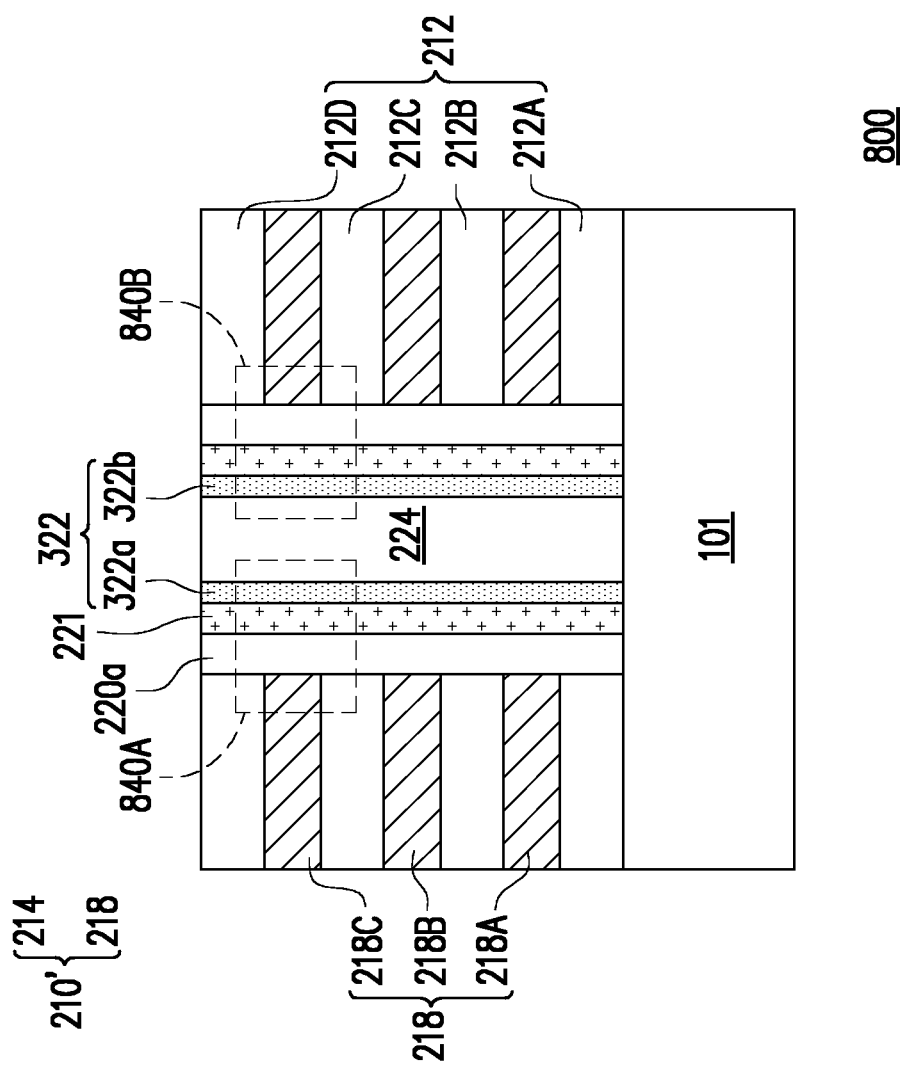
FIG. 22 is a cross-sectional view of a 3D memory device in accordance with a third embodiment.

FIG. 22 is a cross-sectional view of a 3D memory device in accordance with a third embodiment.

Referring to FIG. 22, a 3D memory device 800 is similar to the 3D memory device 700 of FIG. 21A, but the U-shaped channel layer 222 in FIG. 21A is replaced by a pair of individual channel layers 322 respectively on the sidewalls of the dielectric pillar 224. In some embodiments, the channel layers 322 are formed by depositing a channel material that conformally covers the bottom of the opening 20, the sidewall of the buffer layer 221, and further covers the upper surface of the topmost dielectric layer 212D; and then performing an anisotropic etching process to remove the channel material on the bottom of the opening 20 and on the upper surface of the topmost dielectric layer 212D. The material of the channel layers 322 is similar to the material of the channel layer 222, and are detail illustrated in the above embodiment, and thus details thereof are omitted herein. After forming the channel layers 322, the dielectric pillar 224 and/or other isolation structure is formed in the opening to electrically isolate the channel layers 322a and 322b. Since the continuous channel layer 222 of FIG. 21A is divided into two separate, independent channel layers 322a and 322b, the number of memory cells in the 3D memory device 800 is double that of the 3D memory device 700. The dashed boxes 840A and 840B in FIG. 22 show two memory cells formed in a region that corresponds to the memory cell 740 in FIG. 21A.

Figure 23:
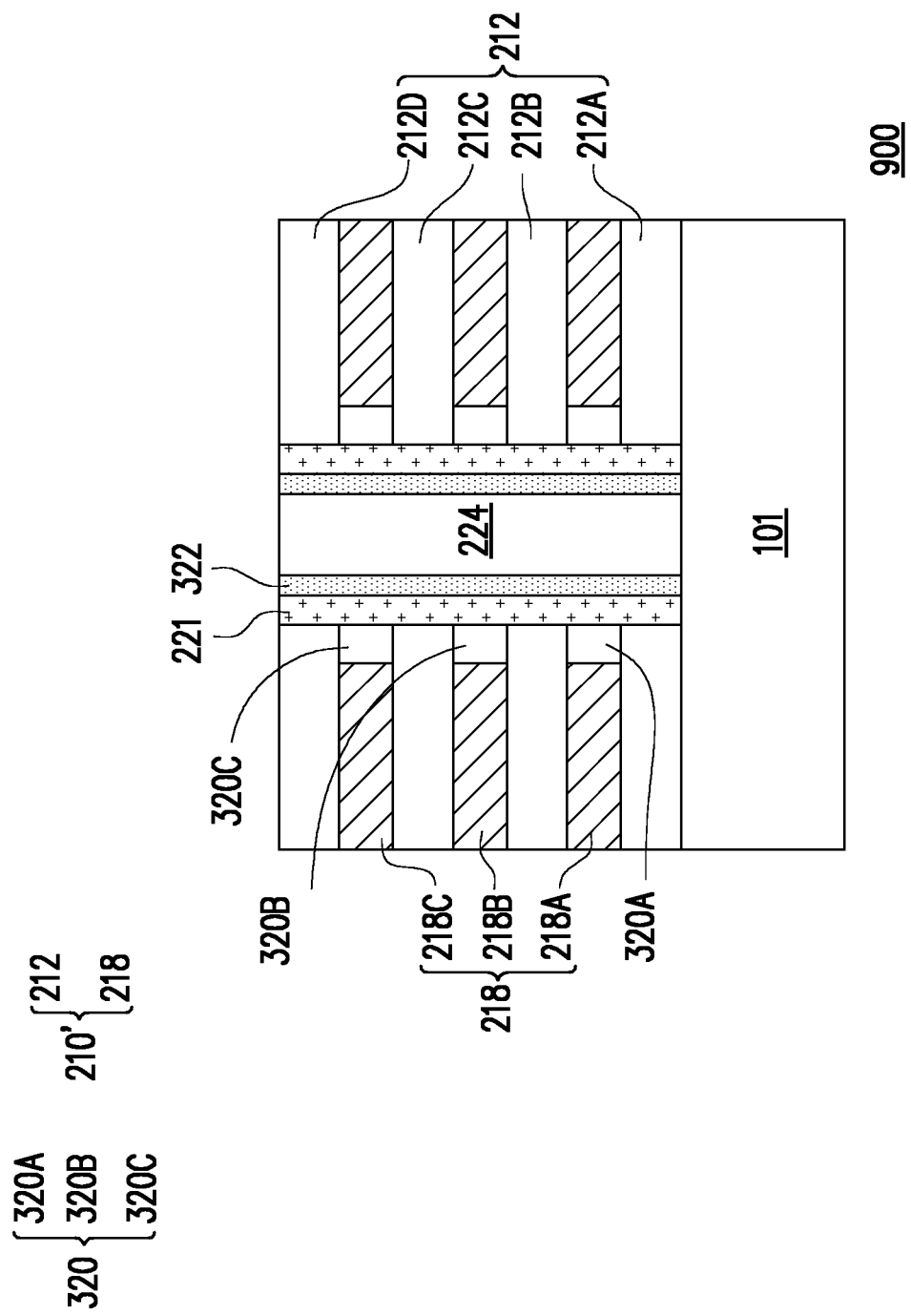
FIG. 23 is a cross-sectional view of a 3D memory device in accordance with a fourth embodiment.

FIG. 23 is a cross-sectional view of a 3D memory device in accordance with a fourth embodiment.

Referring to FIG. 23, a 3D memory device 900 is similar to the 3D memory device 800 of FIG. 22, but the continuous ferroelectric layer 220a in FIG. 22 is replaced by a plurality of ferroelectric layers or segments 320A, 320B, and 320C (collectively referred to as the ferroelectric layers 320). The ferroelectric layers 320 are respectively embedded between adjacent dielectric layers 212 and contacting the corresponding conductive layers 218. In some embodiments, one of the ferroelectric layers 320 and the corresponding conductive layer 218 is at substantially the same level. Herein, when elements are described as "at substantially the same level", the elements are formed at substantially the same height in the same layer, or having the same positions embedded by the same layer. In some embodiments, the tops of the elements at substantially the same level are substantially coplanar. For example, as shown in FIG. 23, the ferroelectric layer 320A and the corresponding conductive layer 218A have the same height in the same layer, and the top or bottom surfaces of the ferroelectric layers 320A and the corresponding conductive layer 218A are substantially coplanar.

It should be noted that, in the embodiment, the separate and individual ferroelectric layers 320 is able to decrease the crosstalk or the coupling interference between the adjacent memory cells, thereby increasing the performance and the reliability of the 3D memory device 900.

In some embodiments, the ferroelectric layers 320 are formed by adding additional processing steps in the foregoing process steps illustrated in FIG. 15 to FIG. 19. In detail, portions of the sacrificial layers 214 in FIG. 16A are laterally etched through the opening 20, so that a plurality of spaces are formed between adjacent dielectric layers 212. In this case, the sidewalls of the sacrificial layers 214 are recessed, and the sidewalls of the sacrificial layers 214 are not aligned with the sidewalls of the dielectric layers 212. Next, a ferroelectric material is formed to fill in the spaces between adjacent dielectric layers 212. In some embodiments, the ferroelectric material not only fills up the spaces between adjacent dielectric layers 212, but also further covers the sidewalls of the dielectric layers 212, the upper surface of the topmost dielectric layer 212D, and the bottom of the opening 20. Thereafter, the excessive portions of the ferroelectric material covering the sidewalls of the dielectric layers 212, the upper surface of the topmost dielectric layer 212D, and the bottom of the opening 20 are removed, so as to form the separate and independent ferroelectric layers 320 respectively. Then, the buffer layer 221 is formed to cover the dielectric layers 212 and the ferroelectric layers 320, as shown in FIG. 23.

Although the channel layers 322 illustrated in FIG. 23 are I-shaped along the sidewalls of the dielectric pillar 224, the embodiments of the present disclosure are not limited thereto. In other embodiments, the channel layer of FIG. 23 may be U-shaped to wrap the sidewalls and the bottom of the dielectric pillar 224, as shown in FIG. 21A. In addition, the separate and independent ferroelectric layers 320 may be applied to the architecture of the 3D memory cell 100 illustrated in FIG. 10B. Further, the buffer layer 221 with a single-layered structure of FIG. 23 may be replaced by alternative buffer layer with a bi-layered structure (as shown in FIG. 14A and FIG. 14B), a triple-layered structure (as shown in FIG. 14C and FIG. 14D), or a multi-layered structure.

Figure 24:
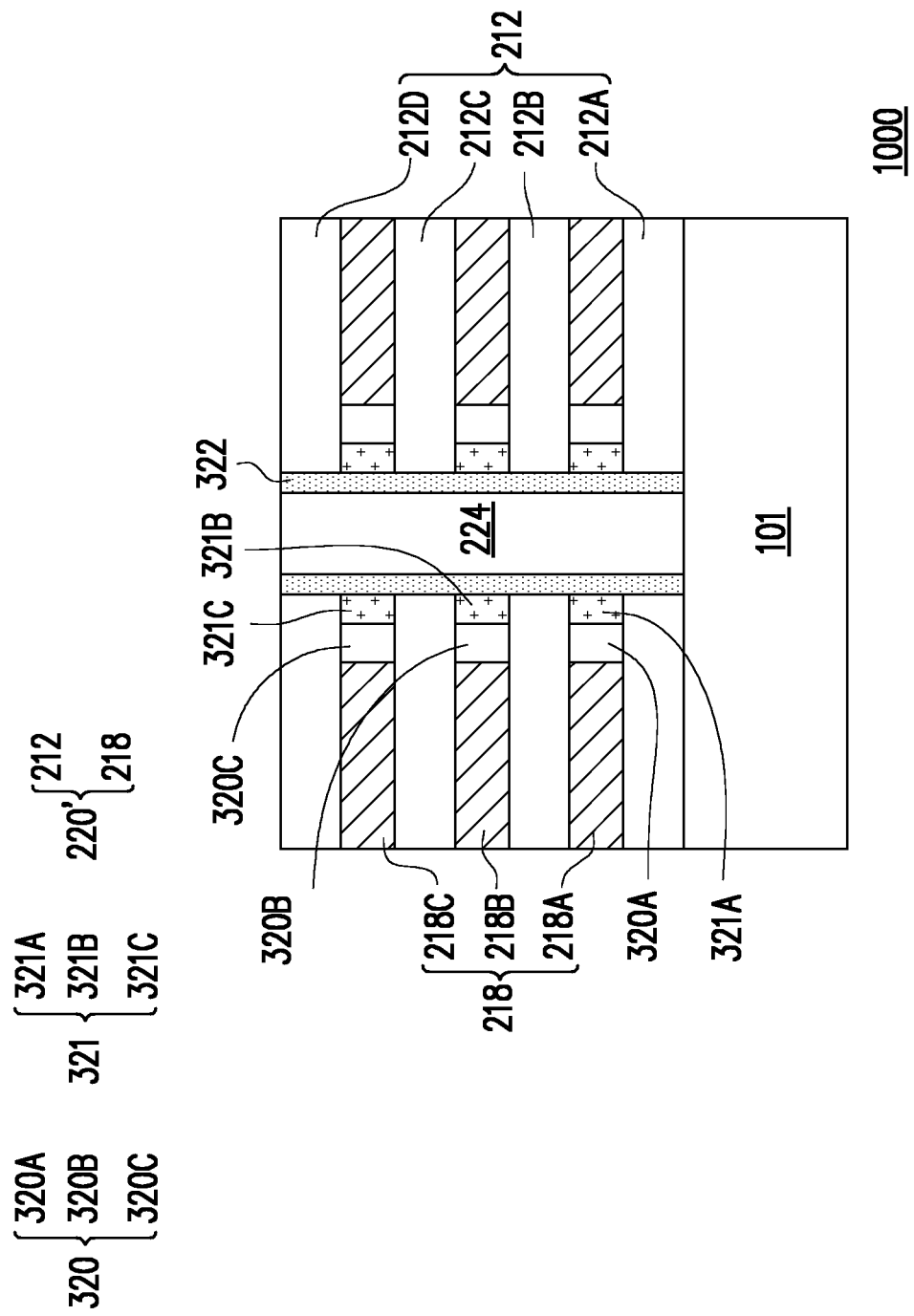
FIG. 24 is a cross-sectional view of a 3D memory device in accordance with a fifth embodiment.

FIG. 24 is a cross-sectional view of a 3D memory device in accordance with a fifth embodiment.

Referring to FIG. 24, a 3D memory device 1000 is similar to the 3D memory device 900 of FIG. 23, but the continuous buffer layer 221 in FIG. 23 is replaced by a plurality of buffer layers or segments 321A, 321B, and 321C (collectively referred to as the buffer layers 321). The buffer layers 321 are respectively embedded between adjacent dielectric layers 212 and contacting a corresponding ferroelectric layer 320. In some embodiments, one of the buffer layers 321 and the corresponding conductive layer 218 and ferroelectric layer 320 are at substantially the same level. That is, as shown in FIG. 24, the buffer layer 321A, the corresponding ferroelectric layer 320A and the corresponding conductive layer 218A have the same height in the same layer, and the top or bottom surfaces of the buffer layer 321A, the corresponding ferroelectric layer 320A and the corresponding conductive layer 218A are substantially coplanar.

The process steps of the buffer layers 321 are similar to the process steps of the ferroelectric layers 320, and are detail illustrated in the above embodiment, and thus details thereof are omitted herein. After forming the buffer layers 321, the channel layer 322 is formed to cover the dielectric layers 212 and the buffer layers 321, as shown in FIG. 24. Although the channel layers 322 illustrated in FIG. 24 are I-shaped along the sidewalls of the dielectric pillar 224, the embodiments of the present disclosure are not limited thereto. In other embodiments, the channel layer of FIG. 24 may be U-shaped to wrap the sidewalls and the bottom of the dielectric pillar 224, as shown in FIG. 21A. In addition, the separate and independent ferroelectric and buffer layers 320 and 321 may be applied to the architecture of the 3D memory cell 100 illustrated in FIG. 10B. Further, the buffer layer 321 with a single-layered structure of FIG. 24 may be replaced by alternative buffer layer with a bi-layered structure (as shown in FIG. 14A and FIG. 14B), a triple-layered structure (as shown in FIG. 14C and FIG. 14D), or a multi-layered structure.

Figure 25:
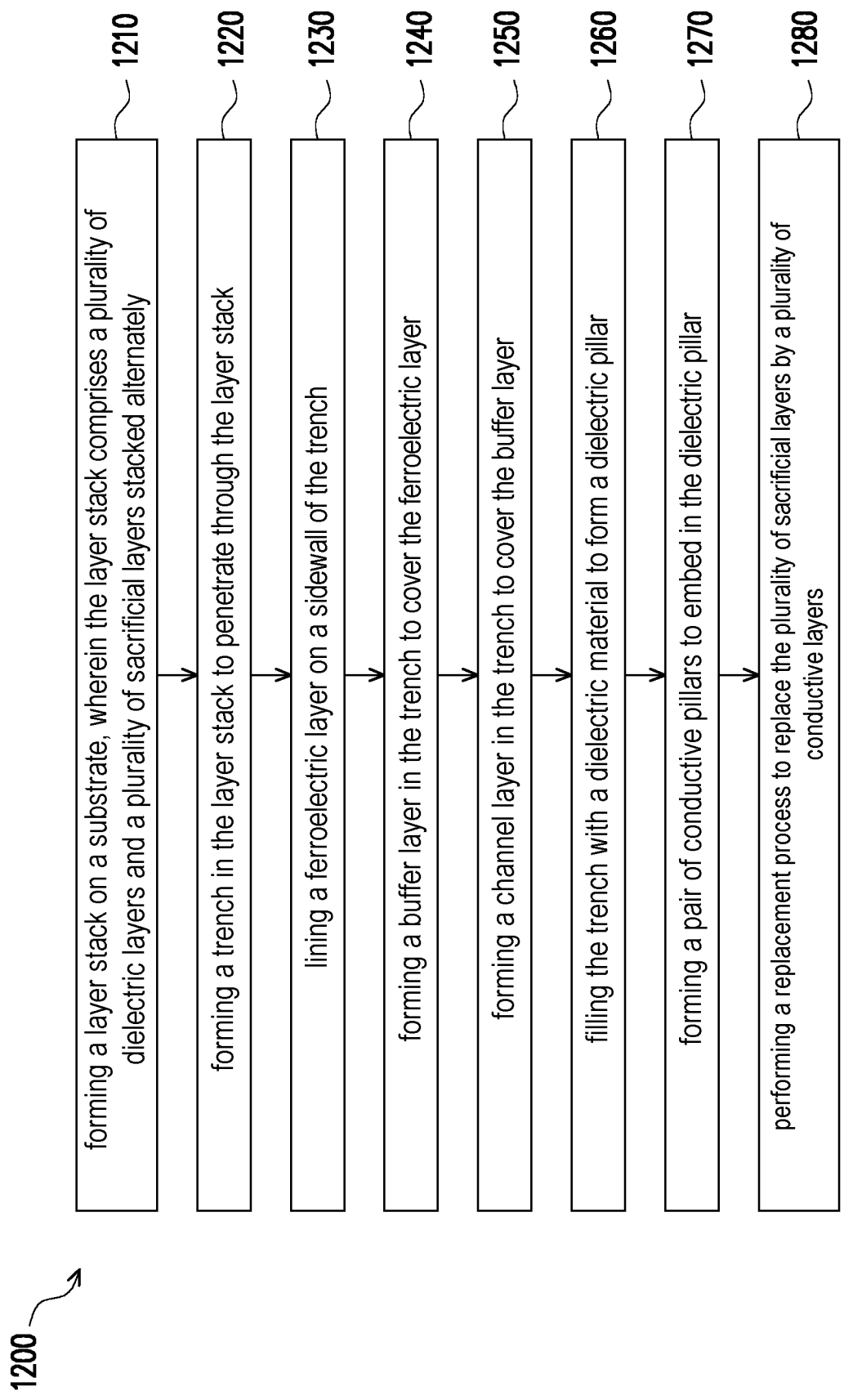
FIG. 25 illustrates a flow chart of a method of forming a 3D memory device in accordance with some embodiments.

FIG. 25 illustrates a flow chart 1200 of a method of forming a 3D memory device in accordance with some embodiments. While disclosed method 1200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases. FIG. 25 may illustrate some embodiments of the method disclosed by FIG. 2A to FIG. 10B.

Figures 2A, 2B:
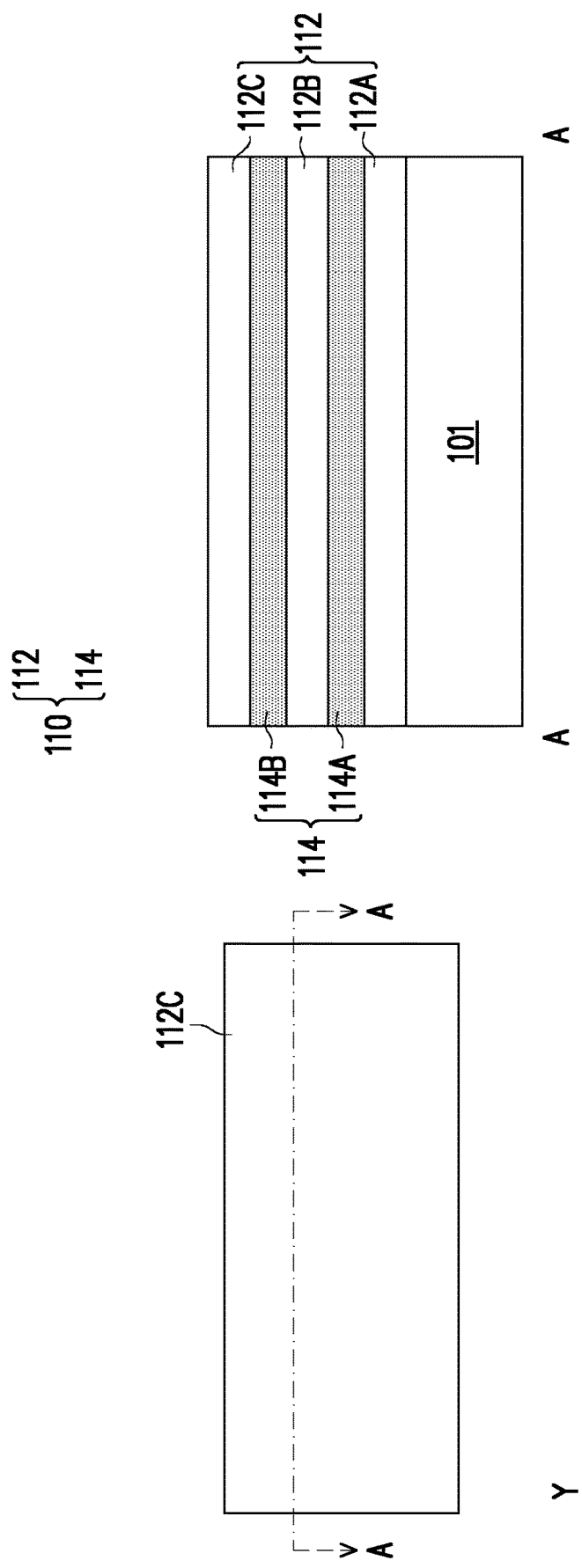

Referring to FIG. 25, at block 1210, a layer stack is formed on a substrate, wherein the layer stack comprises a plurality of dielectric layers and a plurality of sacrificial layers stacked alternately. FIG. 2A and FIG. 2B illustrate the top view and the cross-sectional view corresponding to some embodiments corresponding to block 1210.

At block 1220, a trench is formed in the layer stack to penetrate through the layer stack. FIG. 3A and FIG. 3B illustrate the top view and the cross-sectional view corresponding to some embodiments corresponding to block 1220.

At block 1230, a ferroelectric layer is formed to line on a sidewall of the trench. At block 1240, a buffer layer is formed in the trench to cover the ferroelectric layer. At block 1250, a channel layer is formed in the trench to cover the buffer layer. At block 1260, the trench is filled with a dielectric material to form a dielectric pillar. FIG. 4A and FIG. 4B illustrate the top views and the cross-sectional views corresponding to some embodiments corresponding to block 1230-block 1260.

At block 1270, a pair of conductive pillars are formed to embed in the dielectric pillar. FIG. 5A to FIG. 6A and FIG. 5B to FIG. 6B illustrate the top views and the cross-sectional views corresponding to some embodiments corresponding to block 1270.

At block 1280, a replacement process is performed to replace the plurality of sacrificial layers by a plurality of conductive layers. FIG. 8A to FIG. 10A and FIG. 8B to FIG. 10B illustrate the top views and the cross-sectional views corresponding to some embodiments corresponding to block 1280.

In accordance with an embodiment, a memory device includes a substrate, a layer stack, and a plurality of composite pillar structures. The layer stack is disposed on the substrate. The layer stack includes a plurality of conductive layers and a plurality of dielectric layers stacked alternately. The composite pillar structures respectively penetrate through the layer stack. Each composite pillar structure includes a dielectric pillar; a pair of conductive pillars penetrating through the dielectric pillar and electrically isolated from each other through a portion of the dielectric pillar; a channel layer covering both sides of the dielectric pillar and the pair of conductive pillars; a ferroelectric layer disposed between the channel layer and the layer stack; and a buffer layer disposed between the channel layer and the ferroelectric layer.

In accordance with an embodiment, a memory device includes a layer stack disposed on a substrate, wherein the layer stack comprises a plurality of conductive layers and a plurality of dielectric layers stacked alternately; a dielectric pillar penetrating through the layer stack; a channel layer surrounding the dielectric pillar; a ferroelectric layer disposed between the channel layer and the layer stack; and a buffer layer disposed between the ferroelectric layer and the channel layer.

In accordance with an embodiment, a method of forming a memory device includes forming a layer stack on a substrate, wherein the layer stack comprises a plurality of dielectric layers and a plurality of sacrificial layers stacked alternately; forming a trench in the layer stack to penetrate through the layer stack; lining a ferroelectric layer on a sidewall of the trench; forming a buffer layer in the trench to cover the ferroelectric layer; forming a channel layer in the trench to cover the buffer layer; filling the trench with a dielectric material to form a dielectric pillar; forming a pair of conductive pillars to embed in the dielectric pillar; and performing a replacement process to replace the plurality of sacrificial layers by a plurality of conductive layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
 a layer stack disposed on a substrate, wherein the layer stack comprises a plurality of conductive layers and a plurality of dielectric layers stacked alternately;
 a plurality of composite pillar structures respectively penetrating through the layer stack, wherein each composite pillar structure comprises:
  a dielectric pillar;
  a pair of conductive pillars penetrating through the dielectric pillar and electrically isolated from each other through a portion of the dielectric pillar;
  a channel layer covering both sides of the dielectric pillar and the pair of conductive pillars;
  a ferroelectric layer disposed between the channel layer and the layer stack; and
  a buffer layer disposed between the channel layer and the ferroelectric layer, wherein the buffer layer is a nitrogen-doped dielectric layer and a nitrogen doping concentration of the buffer layer is a gradient distribution.

2. The memory device of claim 1, wherein the buffer layer comprises a dielectric material having a dielectric constant greater than 5.

3. The memory device of claim 1, wherein the buffer layer comprises a single-layered structure, a bi-layered structure, a triple-layered structure, or a multi-layered structure.

4. The memory device of claim 1, wherein the buffer layer at least comprises:
    a first dielectric material contacting the ferroelectric layer; and
    a second dielectric material contacting the channel layer, wherein the first and second dielectric materials have different dielectric constants.

5. The memory device of claim 1, wherein the buffer layer is a nitrogen-doped $Al_2O_3$ layer.

6. The memory device of claim 1, wherein the nitrogen doping concentration of the buffer layer gradually increases along a direction from the ferroelectric layer to the channel layer.

7. The memory device of claim 1, wherein the nitrogen doping concentration of the buffer layer gradually decreases along a direction from the ferroelectric layer to the channel layer.

8. The memory device of claim 1, further comprising a plurality of isolation structures respectively penetrating through the layer stack, and respectively dispose between the plurality of composite pillar structures to electrically isolate the plurality of composite pillar structures, wherein one of the plurality of composite pillar structures and a corresponding conductive layer at one side thereof constitute a memory cell.

9. The memory device of claim 8, wherein a plurality of memory cells arranged alternately in a Y direction share a same word line, and a plurality of memory cells arranged alternately in a Z direction share a same bit line and a same source line.

10. A memory device, comprising:
    a layer stack disposed on a substrate, wherein the layer stack comprises a plurality of conductive layers and a plurality of dielectric layers stacked alternately;
    a dielectric pillar penetrating through the layer stack;
    a channel layer surrounding the dielectric pillar;
    a ferroelectric layer disposed between the channel layer and the layer stack; and
    a buffer layer disposed between the ferroelectric layer and the channel layer, wherein the buffer layer is a nitrogen-doped dielectric layer and a nitrogen doping concentration of the buffer layer is a gradient distribution.

11. The memory device of claim 10, wherein the channel layer further extends to cover a bottom surface of the dielectric pillar, so that the channel layer is U-shaped in cross-section.

12. The memory device of claim 10, wherein the ferroelectric layer is embedded between two adjacent dielectric layers and contacting a corresponding conductive layer.

13. The memory device of claim 10, wherein the ferroelectric layer and the buffer layer are both embedded between two adjacent dielectric layers, and the ferroelectric layer, the buffer layer, and a corresponding conductive layer are at a same level.

14. The memory device of claim 10, wherein the buffer layer at least comprises:
    a first dielectric material contacting the ferroelectric layer; and
    a second dielectric material contacting the channel layer, wherein the first and second dielectric materials have different dielectric constants.

15. A method of forming a memory device, comprising:
    forming a layer stack on a substrate, wherein the layer stack comprises a plurality of dielectric layers and a plurality of sacrificial layers stacked alternately;
    forming a trench in the layer stack to penetrate through the layer stack;
    lining a ferroelectric layer on a sidewall of the trench;
    forming a buffer layer in the trench to cover the ferroelectric layer, wherein the buffer layer is a nitrogen-doped dielectric layer and a nitrogen doping concentration of the buffer layer is a gradient distribution;
    forming a channel layer in the trench to cover the buffer layer;
    filling the trench with a dielectric material to form a dielectric pillar;
    forming a pair of conductive pillars to embed in the dielectric pillar; and
    performing a replacement process to replace the plurality of sacrificial layers by a plurality of conductive layers.

16. The method of claim 15, wherein the plurality of dielectric layers and the plurality of sacrificial layers comprise materials with different etching selectivities.

17. The method of claim 15, wherein the forming the pair of conductive pillars comprises:
    forming a first opening and a second opening separated from each other in the dielectric pillar, wherein the first and second openings expose a portion of the substrate; and
    filling the first and second openings with a conductive material.

18. The method of claim 15, further comprising forming a plurality of isolation structures in the dielectric pillar, wherein the plurality of isolation structures extend to cut off the channel layer, so as to contact the buffer layer.

19. The method of claim 15, further comprising forming a plurality of isolation structures in the dielectric pillar, wherein the plurality of isolation structures extend to cut off the channel layer and the buffer layer, so as to contact the ferroelectric layer.

20. The method of claim 15, further comprising forming a plurality of isolation structures in the dielectric pillar, wherein the plurality of isolation structures extend to cut off the channel layer, the buffer layer, and the ferroelectric layer, so as to contact a corresponding conductive layer.

* * * * *